United States Patent
Chang et al.

(10) Patent No.: US 11,715,656 B2
(45) Date of Patent: Aug. 1, 2023

(54) CHEMICAL LIQUID SUPPLYING SYSTEM AND METHOD OF SUPPLYING CHEMICAL LIQUID

(71) Applicant: TAIWAN SEMICONDUCTOR MANUFACTURING CO., LTD., Hsinchu (TW)

(72) Inventors: Yu-Cheng Chang, Miaoli County (TW); Keng-Hui Pan, Tainan (TW); Chieh-Jan Huang, Hsinchu (TW); Ming-Lee Lee, Kaohsiung (TW); Chiang-Jeh Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 529 days.

(21) Appl. No.: 16/837,507

(22) Filed: Apr. 1, 2020

(65) Prior Publication Data
US 2021/0202285 A1    Jul. 1, 2021

Related U.S. Application Data

(60) Provisional application No. 62/953,756, filed on Dec. 26, 2019.

(51) Int. Cl.
*H01L 21/02* (2006.01)
*H01L 21/67* (2006.01)
*H01L 21/306* (2006.01)

(52) U.S. Cl.
CPC .. *H01L 21/67253* (2013.01); *H01L 21/02008* (2013.01); *H01L 21/306* (2013.01); *H01L 21/6715* (2013.01); *H01L 21/67294* (2013.01)

(58) Field of Classification Search
CPC .................................................. H01L 21/02052
See application file for complete search history.

(56) References Cited

U.S. PATENT DOCUMENTS

| | | |
|---|---|---|
| 6,523,861 B1 | 2/2003 | Clancy et al. |
| 2004/0100860 A1 | 5/2004 | Wilmer et al. |
| 2006/0283932 A1 | 12/2006 | Asp et al. |
| 2007/0069885 A1 | 3/2007 | Twitchell |
| 2014/0206110 A1 | 7/2014 | Lee et al. |
| 2021/0313191 A1* | 10/2021 | Negoro ............... H01L 21/6708 |

FOREIGN PATENT DOCUMENTS

| | | |
|---|---|---|
| JP | 2005-306541 A | 11/2005 |
| JP | 2017-135204 A | 8/2017 |
| KR | 10-2012-0041058 A | 4/2012 |
| KR | 10-1667601 B1 | 10/2018 |
| KR | 10-2019-0053325 A | 5/2019 |

* cited by examiner

*Primary Examiner* — Jae Lee
(74) *Attorney, Agent, or Firm* — Birch, Stewart, Kolasch & Birch, LLP

(57) ABSTRACT

In accordance with some embodiments, a method for processing semiconductor wafer is provided. The method includes connecting a drum which stores the chemical liquid with a testing pipe. The method also includes guiding the chemical liquid in the drum into the testing pipe. In addition, the method includes detecting a condition of the chemical liquid in the testing pipe. The method further includes determining if the condition of the chemical liquid is acceptable. When the condition of the chemical liquid is acceptable, supplying the chemical liquid to a processing tool at which the semiconductor wafer is processed.

20 Claims, 17 Drawing Sheets

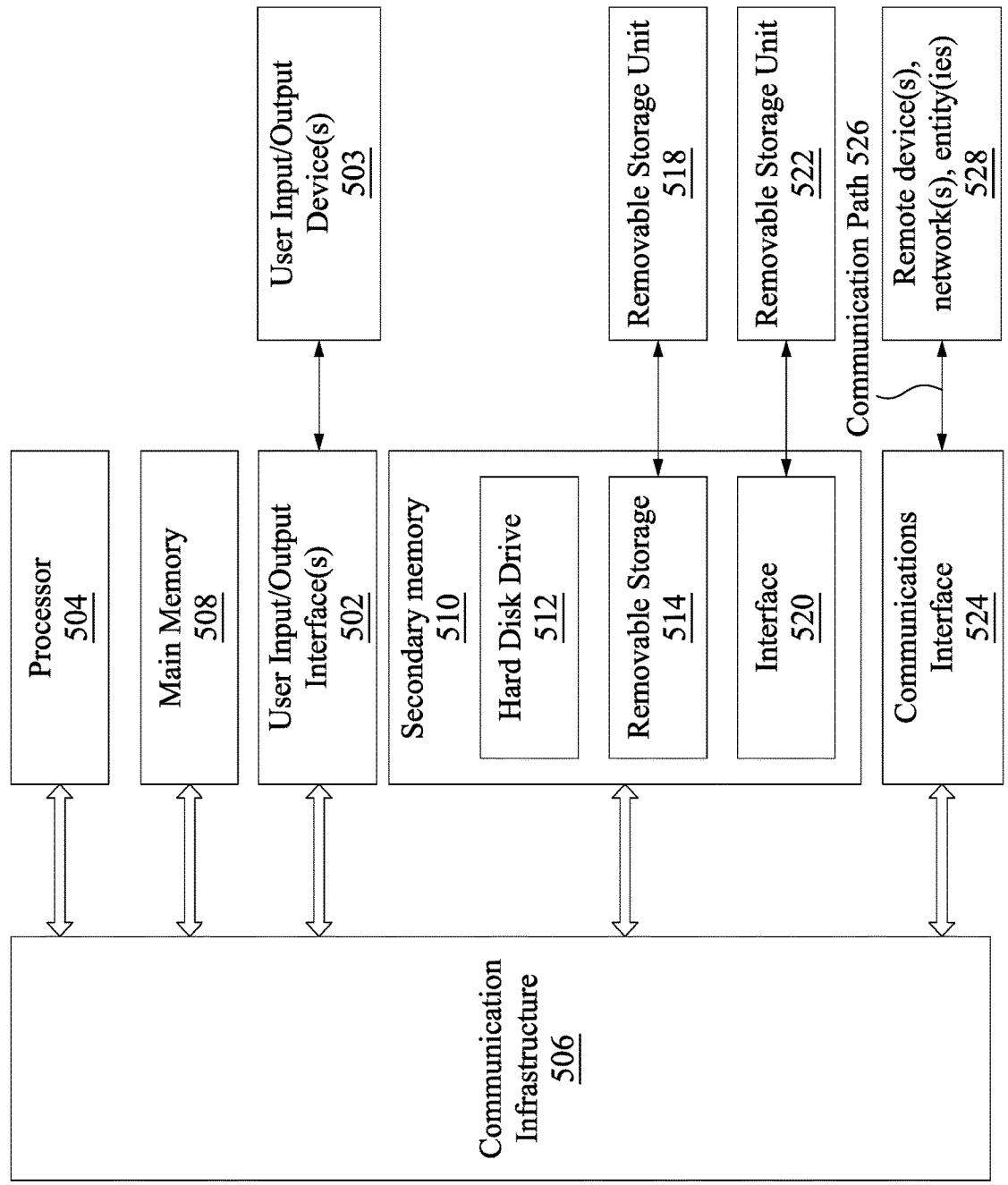

US 11,715,656 B2

CHEMICAL LIQUID SUPPLYING SYSTEM AND METHOD OF SUPPLYING CHEMICAL LIQUID

PRIORITY CLAIM AND CROSS-REFERENCE

This application claims the benefit of U.S. Provisional Application No. 62/953,756, filed on Dec. 26, 2019, the entirety of which is incorporated by reference herein.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

During the manufacturing of the semiconductor devices, various processing steps are used to fabricate integrated circuits on a semiconductor wafer. The wet chemical treatment or cleaning is known to be widely used in semiconductor industry. A chemical liquid will be supplied into a chamber and then rinse the substrate. In order to treat or clean the substrate properly, an adequate amount of chemical solution is supplied over the substrate. If the distribution of the chemical solution is not correctly, the chemical or physical reaction, such as particle removal, wettability improvement, or developing, may not be achieved and this can result in a serious defect which may affect product quality.

Although existing methods and devices for operating the processing steps have generally been adequate for their intended purposes, they have not been entirely satisfactory in all respects. Consequently, it would be desirable to provide a solution for the process control for semiconductor manufacturing operations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 17 shows a block diagram of a controller module of a chemical liquid supplying system, in accordance with some embodiments.

DETAILED DESCRIPTION

Figure 1:
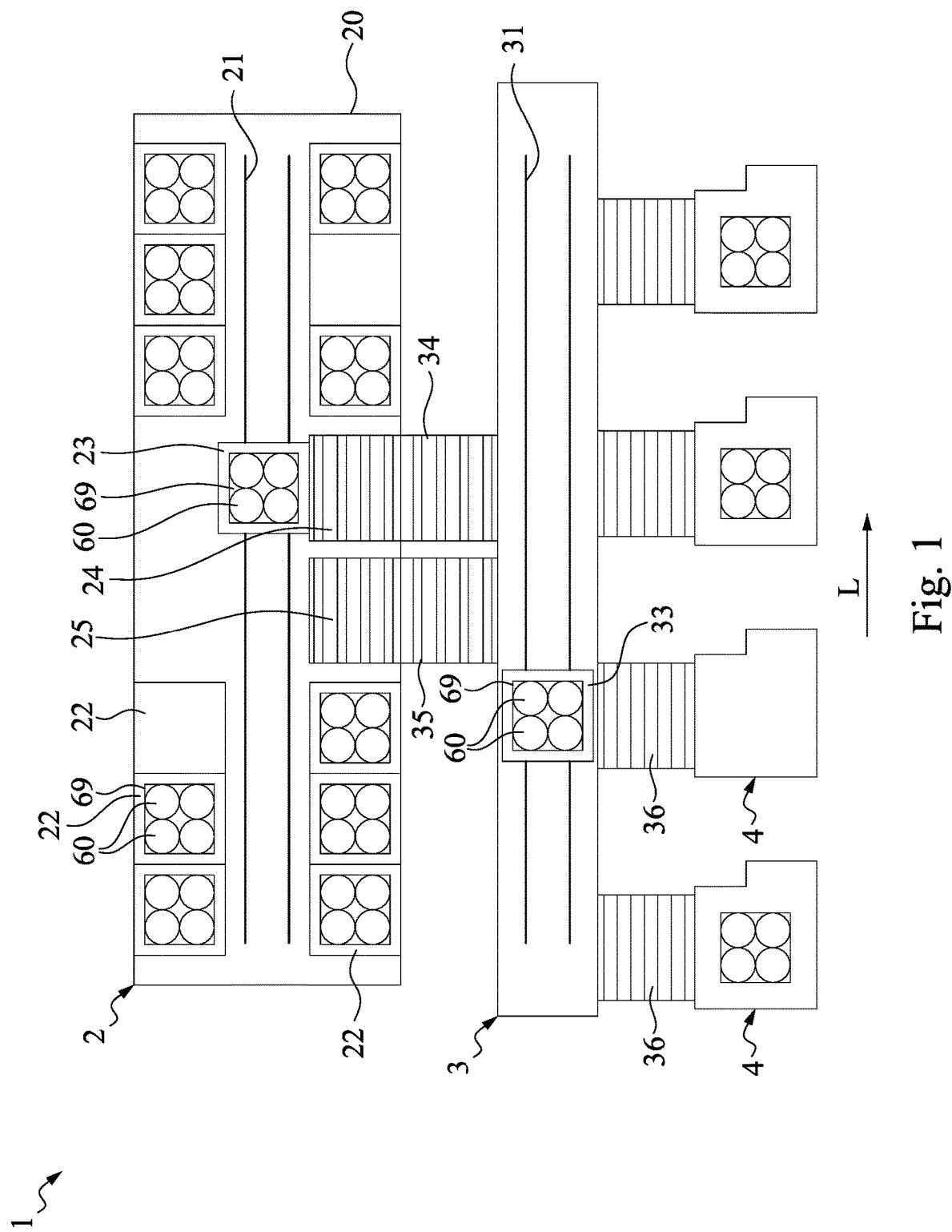
FIG. 1 shows a schematic diagram of a fabrication facility, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In semiconductor fabrication, a chemical liquid is usually used for multiple fabrication processes, for example, ultra-pure water in a wafer cleaning process, acid or alkali liquid in a wet etching process, slurry in a CMP (chemical mechanical polishing) process, and photoresist in a lithography process. In some fabrication processes, the chemical liquid applied directly onto a wafer surface to be processed. The quality of the chemical liquid affects the performance of the fabrication process, such as process defects and a removal rate. However, the quality of the chemical liquid stored is analyzed by an off-line monitor, but not in real time. In other words, the abnormality of the chemical liquid cannot be detected in time, and may cause damages to the wafer surface during the fabrication process before being detected by the off-line monitor, thus resulting in performance degradation of the fabrication process.

Embodiments of the present disclosure are directed to providing a chemical liquid testing and supplying system and a method for real time feed-back controlling the chemical liquid supplying used for a fabrication process. In this method, a chemical liquid in the chemical liquid testing and supplying system is first sampled to obtain a sampled chemical liquid, and then, a parameter of the sampled chemical liquid is measured, and supply of the chemical liquid is controlled based on the parameter. In the embodiments of the present disclosure, the parameter of the sampled chemical liquid is measured in real-time. Therefore, automatic and dynamic control of the chemical liquid supplying is realized, so as to enhance supplying quality and stability of the chemical liquid, and thus process defects and can be improved.

FIG. 1 shows a schematic diagram of a fabrication facility 1, in accordance with some embodiments. In the present disclosure, the fabrication facility 1 is located at a hazardous process material (HPM) building that is connected to wafer fabrication (FAB) building and configured to store or handle chemical liquid for semiconductor wafer fabrication. In some embodiments, the fabrication facility 1 includes a storage system 2, a RGV system 3 and a number of chemical liquid supplying systems 4. Additional features can be added to the fabrication facility 1. Some of the features described below can be replaced or eliminated for additional embodiments of the fabrication facility 1.

In some embodiments, the storage system 2 is an automated storage and retrieval system (AS/RS) and is configured to place and retrieve drums 60 from defined locations. In some embodiments, the storage system 2 includes a chassis 20, a number of storage shelves 22, a transferring mechanism 23, and a number of load ports 24 and 25. The storage shelves 22 are configured to facilitate the storing of the drums 60 within the chassis 20. In some embodiments, the storage shelves 22 are positioned on two parallel side walls of the chassis 20. In some embodiments, each of the storage shelves 22 is configured to support four drums 60 positioned on a pallet 69. It will be noted that although FIG. 1 illustrates each storage shelf 22 supports four drums 60, storage shelves 22 can have a larger area for storing any number of drums 60, and these drums 60 can be positioned on the same pallet 69 or different pallets 69.

The transferring mechanism 23 is configured to move the drums 60 within the storage system 2. In some embodiments, the transferring mechanism 23 includes an extractor. The transferring mechanism 23 travels along the rail 21 between the two columns of the storage shelves 22 and pulls the requested drums 60 from its location and brings it to an access point, such as the output port 25. In some embodiments, the transferring mechanism 23 also travels vertically through a lift (not shown in figures) to reach overhead storage shelves 22 within the chassis 20.

The input port 24 and the output port 25 are configured to support and dock the drums 60 for facilitating insertion and removal of drums 60 into/from the chassis 20 of the storage system 2. In some embodiments, the input port 24 and the output port 25 are positioned along the rail 21. The input port 24 is used to place the drums 60 thereon to the transferring mechanism 23, and the output port 25 is used to receive the drums 60 transferred from the transferring mechanism 23. With the automated storage and retrieval system the manpower for transporting the drums 60 can be saved. In one simulated result, 30% of manpower is reduced.

The RGV system 3 is configured to transport the drums 60 over distance in the fabrication facility 1, for example between the storage system 2 and the chemical liquid supplying systems 4. In some embodiments, the RGV system 3 includes a rail 31, a shuttle car 33, an input station 34, an output station 35 and a number of conveyors 36. The rail 31 extends in a longitudinal direction L. The shuttle car 33 travels along the rail 31. The input station 34 and the output station 35 are positioned in such a way that they correspond to the input port 24 and the output port 25 of the storage system 2 for transferring drums 60 from and to the storage system 2. The chemical liquid supplying systems 4 are arranged along the longitudinal direction L. The conveyors 36 are positioned between the rail 31 and the chemical liquid supplying systems 4 to convey the drums 60 between the shuttle car 33 and the chemical liquid supplying systems 4.

Figure 2:
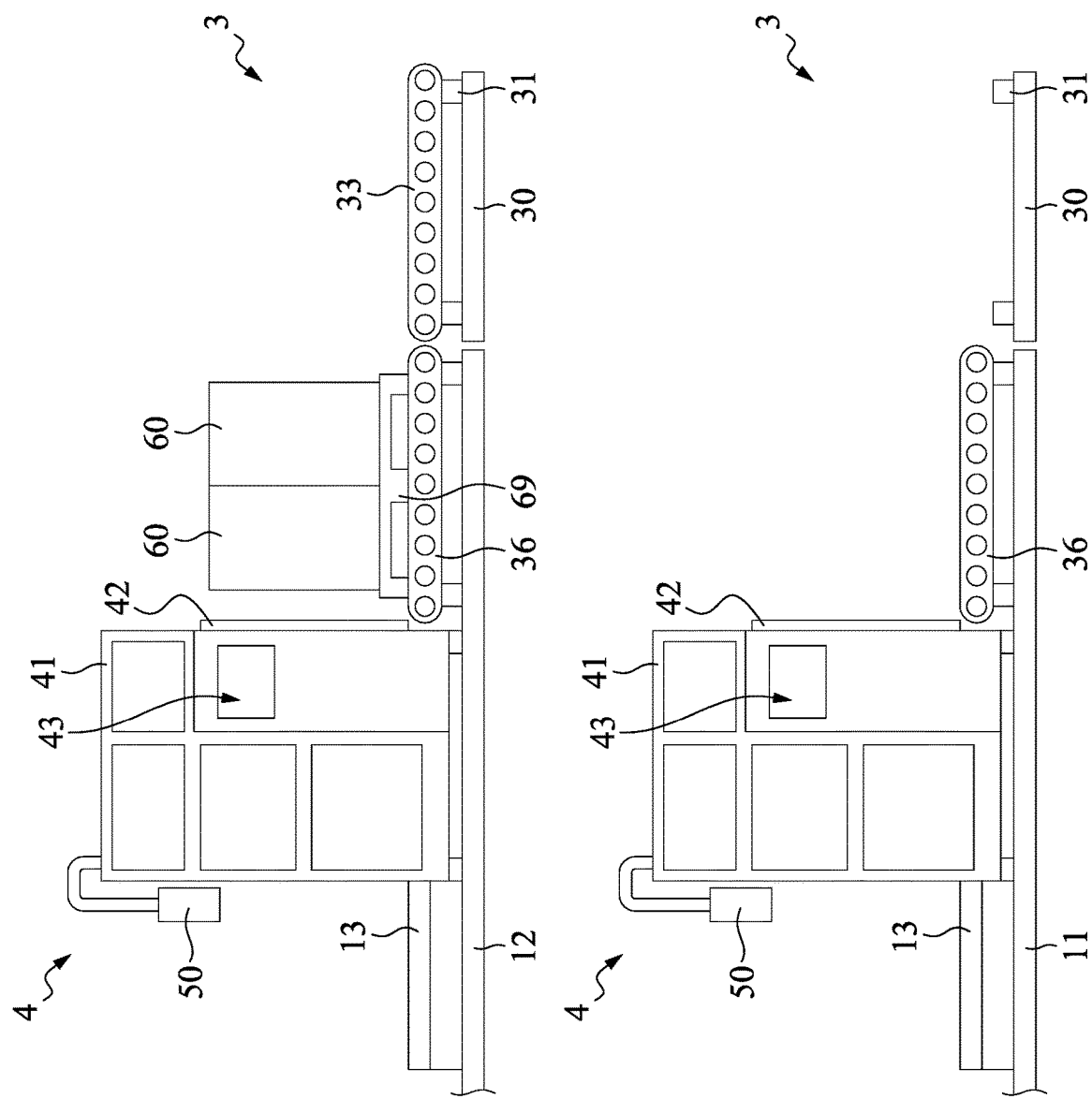
FIG. 2 shows a schematic diagram of partial apparatus in a fabrication facility, in accordance with some embodiments.

FIG. 2 shows a schematic diagram of partial apparatus in the fabrication facility 1, in accordance with some embodiments. In some embodiments, the fabrication facility 1 includes a number of racks, such as racks 11 and 12, located at different levels. The chemical liquid supplying systems 4 are positioned at both racks 11 and 12. In such embodiment, the fabrication facility 1 may further include another RGV system 3 corresponding to the chemical liquid supplying systems 4 located at different levels, and the storage system 2 may also include another input port 24 and the output port 25 for transporting drums to and from the additional RGV system 3. Due to the double deck design (i.e., multiple racks 11 and 12), the numbers of chemical liquid supplying systems 4 in a unit floor space is increased. In one simulated result, 25% of the valuable floor space within the fabrication facility 1 is saved.

Figure 3:
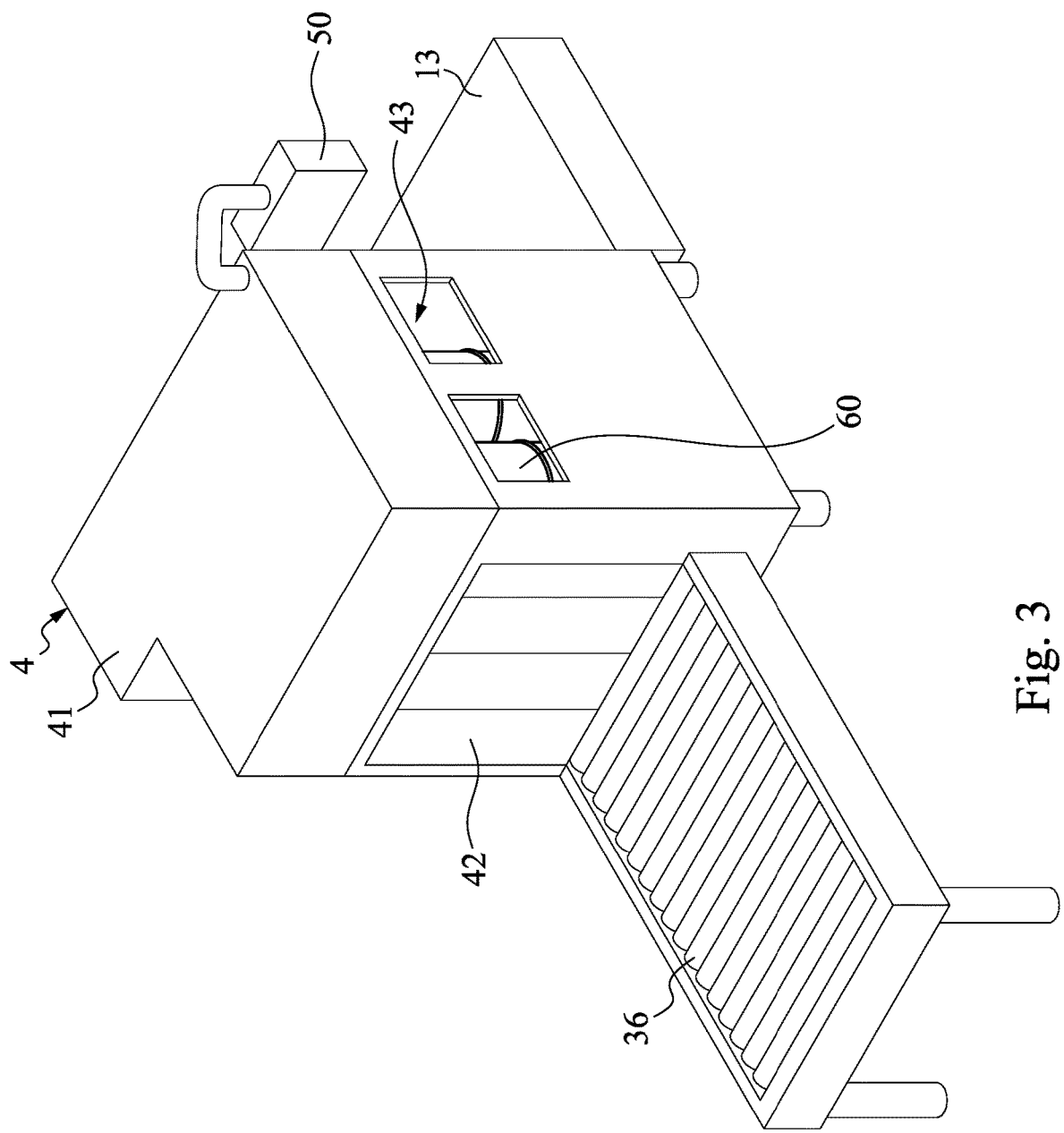
FIG. 3 shows a schematic diagram of a chemical liquid supplying system, in accordance with some embodiments.

FIG. 3 shows a schematic diagram of a chemical liquid supplying system 4, in accordance with some embodiments. In some embodiments, the chemical liquid supplying system 4 includes a housing 41 and a front door 42. The front door 42 is located next to the conveyors 36. Through the front door 42, the drums 60 can be moved into a chamber 43 inside the housing 41. In some embodiments, the front door 42 is an automation door. The chamber 43 may be sealed by a number of hollowed sealing members (not shown in figures) mounted on outer edge of the front door 42 so as to form an air-tight enclosure in the chamber 43. As a result, gas produced due to liquid leakage from the drums 60 can be kept in the chamber 43 and thereby protecting personnel safety and healthy from hazardous substances.

In some embodiments, a platform 13 is positioned at a side of the housing 41 that is opposite to the front door 42. Personnel may stand on the platform 13 to operate the chemical liquid supplying system 4 through the control module 50. However, it will be appreciated that many variations and modifications can be made to embodiments of the disclosure. In some other embodiments, the platform 13 is replaced with another conveyor (not shown in figures), and empty drums are removed from the chamber 43 through a back door (not shown in the figures) located next to the additional conveyor.

Figure 4:
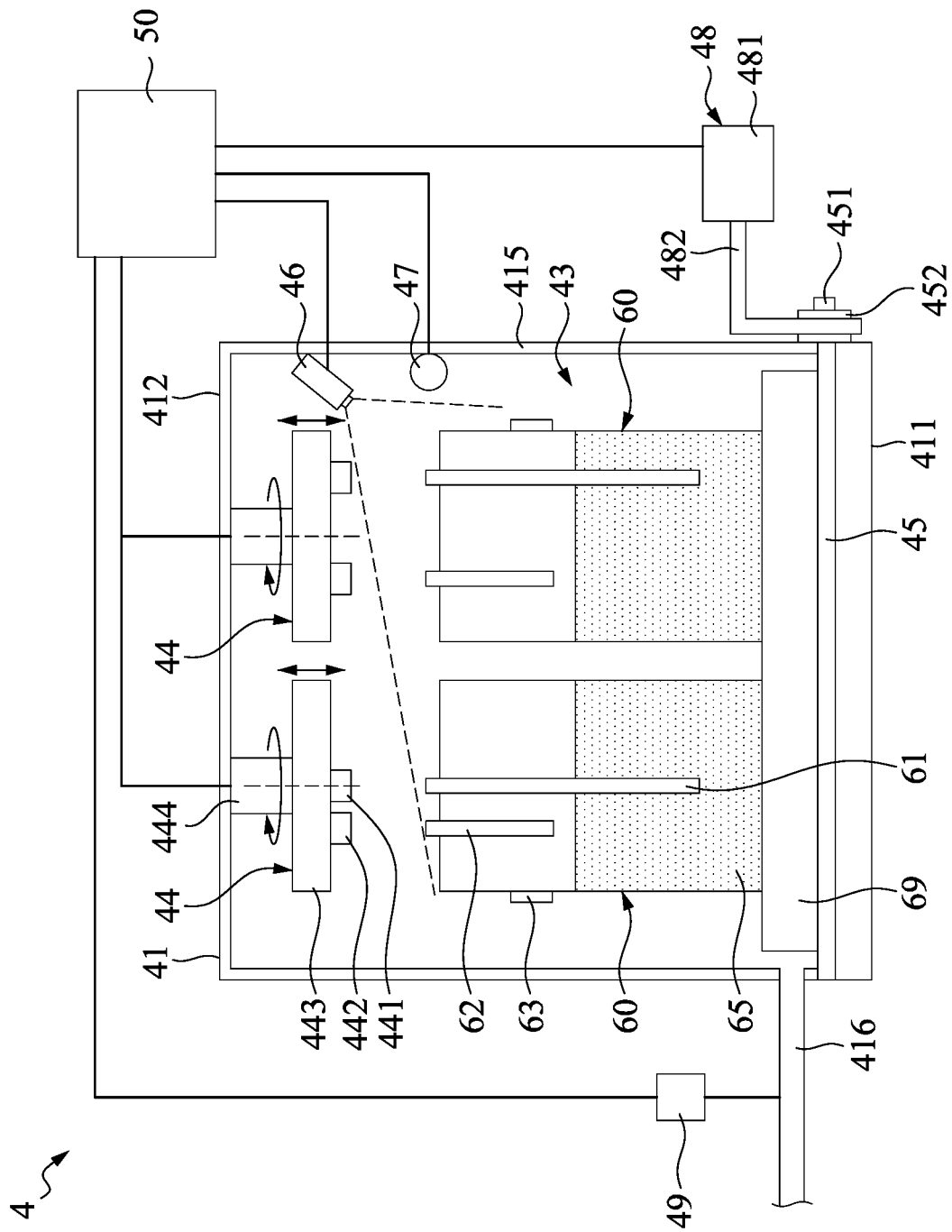
FIG. 4 shows a schematic diagram of partial elements in a chemical liquid supplying system, in accordance with some embodiments.
Figure 9:
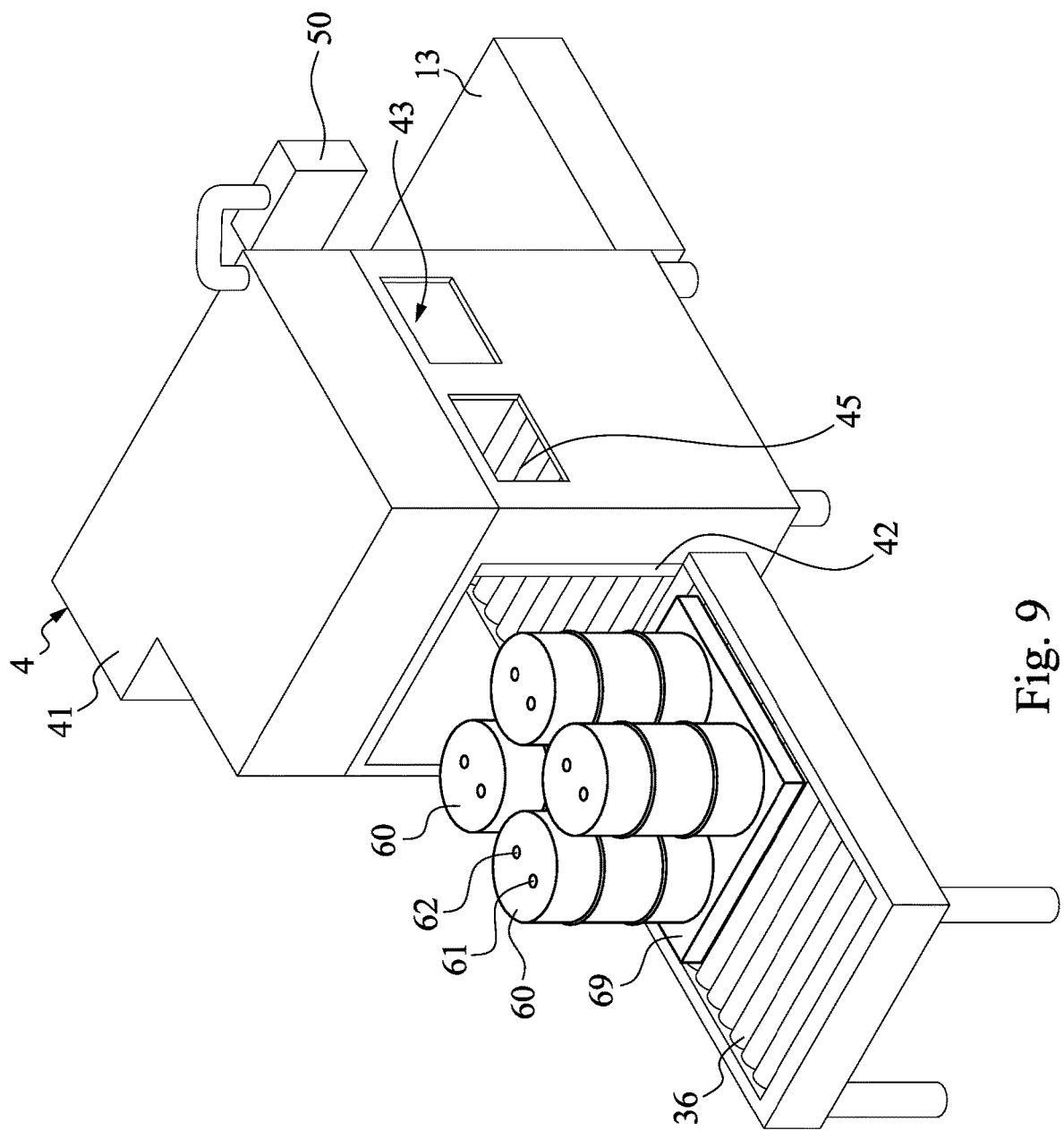
FIG. 9 shows a schematic view of a stage of a method for testing a chemical liquid in semiconductor fabrication facility in which a front door of a chemical liquid supplying system is opened, in accordance with some embodiments.

FIG. 4 shows a schematic diagram of partial elements in the chemical liquid supplying system 4, in accordance with some embodiments. In some embodiments, the chemical liquid supplying system 4 further includes a number of connecting module 44, a number of rollers 45 (FIG. 9 shows this feature more clearly), an imaging module 46, a scanning module 47, and a driving module 48. The connecting modules 44 are positioned at a top wall 412 of the housing 41 and located inside the chamber 43. The connecting modules 44 are respectively configured to connect the drums 60 with a liquid monitoring module 70 (see FIG. 5).

The number of the connecting modules 44 corresponds to the number of drums 60 that can be handled in the chamber 43 at one time. In one exemplary embodiments, the chemical liquid supplying system 4 handles four drums 60 supported by one pallet 69 for chemical liquid supplying through four independent connecting modules 44. However, it will be appreciated that many variations and modifications can be made to embodiments of the disclosure. The chamber 43 may have any suitable width or length depending on the number of drums 60 to be handled in each run.

In some embodiments, each of the connecting modules 44 includes an outlet connector 441, an inlet connector 442, a carrier head 443 and an actuator 444. The outlet connector 441 and the inlet connector 442 are connected two ends of a testing pipe 71 (FIG. 5) and configured to respectively engage with the outlet nozzle 61 and inlet nozzle 62 of the drum 60 located below. In some embodiments, the outlet connector 441 and the inlet connector 442 are mounted on a bottom of the carrier head 443. The carrier head 443 is arranged to be moved around a rotation axis (indicated by dotted line shown in FIG. 4) by the actuator 444. Alternatively or additionally, the carrier head 443 is arranged to be moved in a vertical direction relative to the drums 60 as indicated by the arrows shown in FIG. 4. The carrier head 443 can be moved according to control signals issued from the control module 50 to the actuator 444.

The rollers 45 are configured to horizontally move the pallet 69 along with the drums 60 in the chamber 43. In some embodiments, the rollers 45 are arranged in a side-by-side manner and each of the rollers 45 extends in a direction that is parallel to the front door 42. Two ends of each of the rollers 45 are rotatable connected to a side wall 415 of the housing 41. In some embodiments, as shown in FIG. 4, at least one of the rollers 45 is an active member and has an end portion 451 penetrating through the side wall 415 of the housing 41 and located outside the chamber 43. A wheel 452, such as gear or pulley, is connected to the end portion 451.

In some embodiments, the driving module 48 includes a motor 481 and a transmission element 482. The transmission element 482 is connected to an output shaft (not shown in figures) of the motor 481 and a wheel 452 connected to the end portion 451 of the roller 45. In operation, the transmission element 482 transmits a mechanical power from the motor 481 to the roller 45 so as to actuate the movement of the pallet 69 and the drums 60 positioned on the pallet 69 in the chamber 43. The transmission element 482 may be a belt or a chain. It will be noted that since the wheel 452 that is connected to the transmission element 482 is located outside the chamber 43, the wheel 452 is prevented from liquid corrosion in cases where liquid leaking from the drums 60 occurs. The motor 481 can be driven by control signals issued from the control module 50.

The imaging module 46 is configured to produce image in relation to inside surrounding of the chamber 43. In one exemplary embodiment, the imaging module 46 is configured to produce image in relation to the outlet nozzle 61 and the inlet nozzle 62 of the drums 60 positioned in the chamber 43. In some embodiments, the imaging module 46 includes a wide-angle camera to take picture of all the drums 60 located in the chamber 43 in one image screen. In some other embodiments, the imaging module 46 includes a number of cameras positioned in different positions in the chamber 43, and each of the cameras is used to take picture of one of the drums 60 located in the chamber 43. In some embodiments, the imaging module 46 is configured to produce image in relation to the bottom wall 411 of the housing 41, so as to determine if there is a residual chemical liquid leaking from the drums 60.

The imaging module 46 may outputs raw data or processed data representing the images inside the chamber 43 to the control module 50. For example, the imaging module 46 outputs the signal directly from an image sensor, and the analysis of the images is performed externally (e.g., by a control module 50). In the image analysis, the images of the drums 60 is analyzed to determine the position of the outlet nozzle 61 and the inlet nozzle 62 of each of the drum 60 for facilitating the following engagement with the outlet connector 441 and the inlet connector 442. Alternatively, the imaging module 46 includes a special purpose processor or hardware for performing the image analysis, and outputs a digital or analog signal representing the position of the outlet nozzle 61 and the inlet nozzle 62 of each of the drum 60.

The scanning module 47 is configured to identify the drums 60 transferred into the chamber 43. In some embodiments, the scanning module 47 includes a scanner to scan a tag 63 attached on the drums 60. The tag 63 may be a radio-frequency identification (RFID) and contains electronically stored information in relation to the drum 60. The tag 63 may be a passive tag and collect energy from a nearby scanning module 47 interrogating radio waves. The radio waves have frequencies as high as 300 GHz to as low as 30 Hz. The scanning module 47 outputs data representing the identity of the drum 60 to the control module 50, and the control module 50 match the identity of the drum 60 and a data representing the drum to determine what chemical liquid 65 the drum 60 is storing.

In some embodiments, as shown in FIG. 4, a gas outlet 416 is connected to the side wall 415 of the housing 41. The gas outlet 416 is configured to guide an exhaust gas from the chamber 43 to a gas handling system (not shown in figures). The exhaust gas may be actuated by a pump (not shown in figures) connected to the gas outlet 416, or actuated by underpressure produced in the gas handling system. In some embodiments, a gas detector 49 is connected to the gas outlet 416 and configured to detect at least one condition in relation to the exhaust gas flowing in the gas outlet 416. For example, the gas detector 49 is configured to measure concentration of the exhaust gas in the gas outlet 416 and outputs signals in related to measurement results to the control module 50 for further processing.

Figure 5:
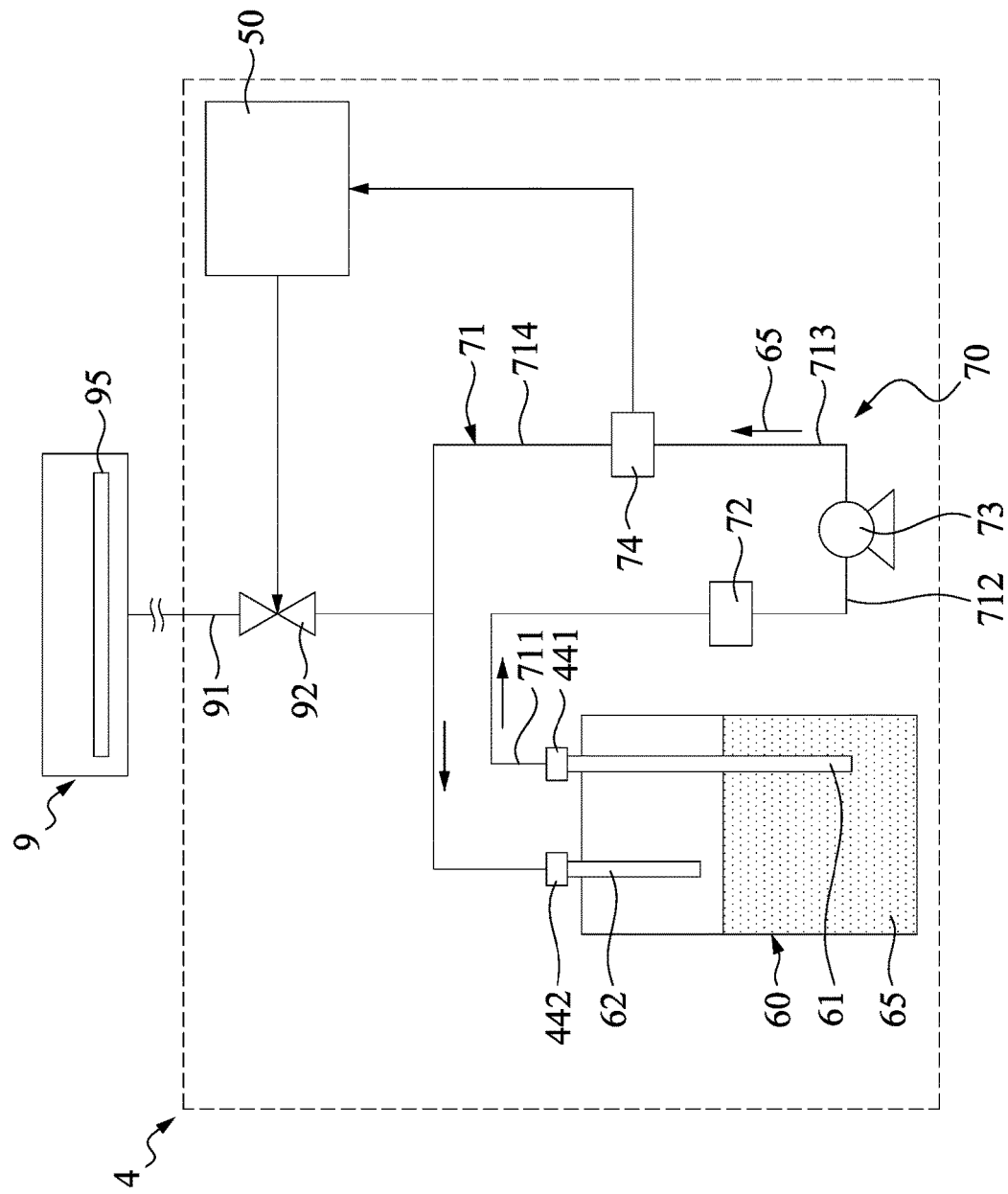
FIG. 5 shows a schematic diagram of partial elements in a chemical liquid supplying system and a processing tool connected with the chemical liquid supplying system, in accordance with some embodiments.

FIG. 5 shows a schematic diagram of partial elements in the chemical liquid supplying system 4 and a processing tool 9 connected with the chemical liquid supplying system 4, in accordance with some embodiments. In some embodiments, the chemical liquid supplying system 4 further includes a liquid monitoring module 70. The liquid monitoring module 70 is configured to sample the chemical liquid 65 stored in the drum 60 and produce data representing at least one condition of the chemical liquid 65 to the control module 50. In some embodiments, the liquid monitoring module 70 includes a testing pipe 71, a filter 72, a pump 73 and a liquid detection assembly 74. The filter 72, the pump 73 and the liquid detection assembly 74 are sequentially arranged along the testing pipe 71.

Specifically, the testing pipe 71 includes a number of segments, such as segment 711, segment 712, segment 713 and segment 714. One end of the segment 711 is connected to the outlet connector 441, and the other end of the segment 711 is connected to the filter 72. One end of the segment 712 is connected to the filter 72, and the other end of the segment 712 is connected to the pump 73. One end of the segment 713 is connected to the pump 73, and the other end of the segment 713 is connected to the liquid detection assembly 74. One end of the segment 714 is connected to the liquid detection assembly 74, and the other end of the segment 714 is connected to the inlet connector 442.

In operation, the pump 73 actuates the flowing of the chemical liquid 65 from the drum 60, sequentially passing through the outlet connector 441, the filter 72, the pump 73, and the liquid detection assembly 74 and recirculated into the drum 60 via the inlet connector 442. In some embodiments, a supplying pipe 91 is connected to the segment 714 of the testing pipe 71 and guides the chemical liquid from the testing pipe 71 to a processing tool 9 at which a semiconductor wafer 95 is processed. A flow control member 92, such a valve, is connected to the supplying pipe 91. When the flow control member 92 is turned on, the chemical liquid passing through the liquid detection assembly 74 enters the supplying pipe 91 and is supplied into the processing tool 9. The operation of the flow control member 92 may be actuated by a control signal issued from the control module 50.

The liquid detection assembly 74 is configured to detect a condition of chemical liquid 65 flowing in the testing pipe 71 and produces data representing the condition of the chemical liquid 65 to the control module 50. In some embodiments, the liquid detection assembly 74 measures at least one condition of the chemical liquid 65 in the testing pipe 71 through different techniques.

Figure 6:
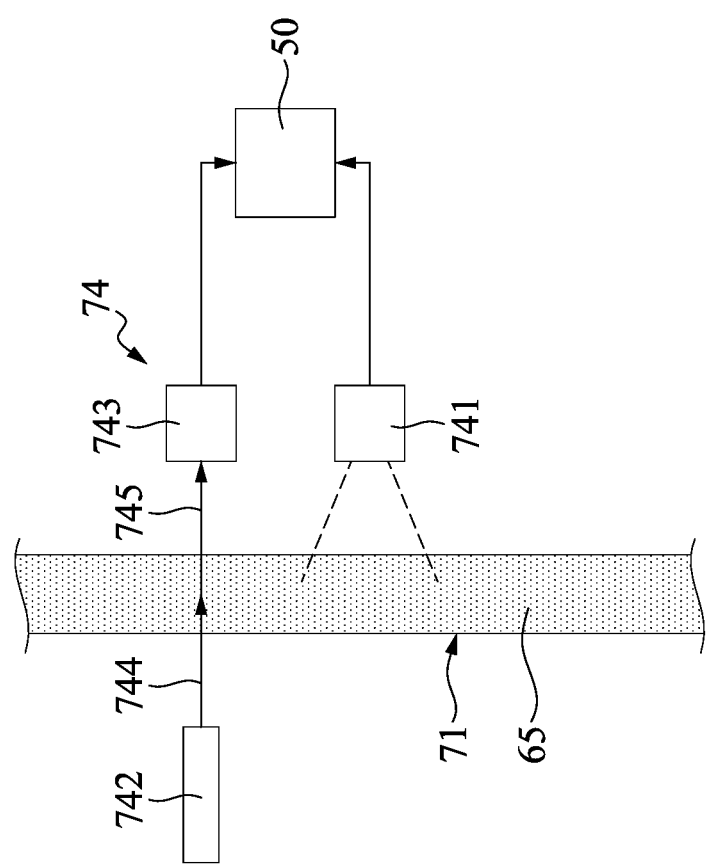
FIG. 6 shows a concept for a liquid testing methodology, in accordance with some embodiments.

For example, as shown in FIG. 6, the liquid detection assembly 74 includes a camera 741, and the testing pipe 71 is made of transparent material, such as glass. As a result, the camera 741 pictures the chemical liquid 65 in the testing pipe 71 and transmits data representing the image in relation to the chemical liquid 65 to the control module 50. Then, the control module 50 compares the data representing the images with an archive database which contains data representing another image demonstrating a standard property of the chemical liquid 65. When the data of the picture is significantly different from the data representing the standard property of the chemical liquid 65, an alarm may be issued.

Alternatively or additionally, as shown in FIG. 6, the liquid detection assembly 74 includes a light source 742 and a transducer 743, and the testing pipe 71 is made of light-permeable material, such as glass, for example. The light source 742 generates a first light beam 744 toward the testing pipe 71. The first light beam 744 is transformed to a second light beam 745 after passing through the testing pipe 71. The second light beam 745 may have different property (e.g., vibration mode) with that of the first light beam 744. The transducer 743 is a mass spectrometer and configured to detect the second light beam 745 and transmits data representing the second light beam 745 to the control module 5D for further processing to determine the condition of the chemical liquid 65.

In one exemplary embodiment of present disclosure, the control module 50 compares the data representing the second light beam 745 with an archive database which contains data representing a standard property of the chemical liquid 65. When the data representing the second light beam 745 is significantly different from the data representing the standard property of the chemical liquid 65, an alarm may be issued. In some embodiments, the chemical liquid 65 is tested through an infrared spectroscopy technique, and the first light beam 744 generated by light source 742 includes infrared radiation. Data representing the second light beam 745 includes, for example, a plot of transmittance versus wavenumber of the second light beam 745. However, it will be appreciated that many variations and modifications can be made to embodiments of the disclosure.

It will appreciated that while the preferred embodiment is intended for using two methodology techniques, i.e., image analysis and infrared spectroscopy technique, for measuring the condition of the chemical liquid 65, the chemical liquid 65 can detected by any number of methodology techniques. In some embodiments, the camera 741 is omitted, and the condition of the chemical liquid 65 is detected by utilizing the infrared spectroscopy technique.

Figure 7:
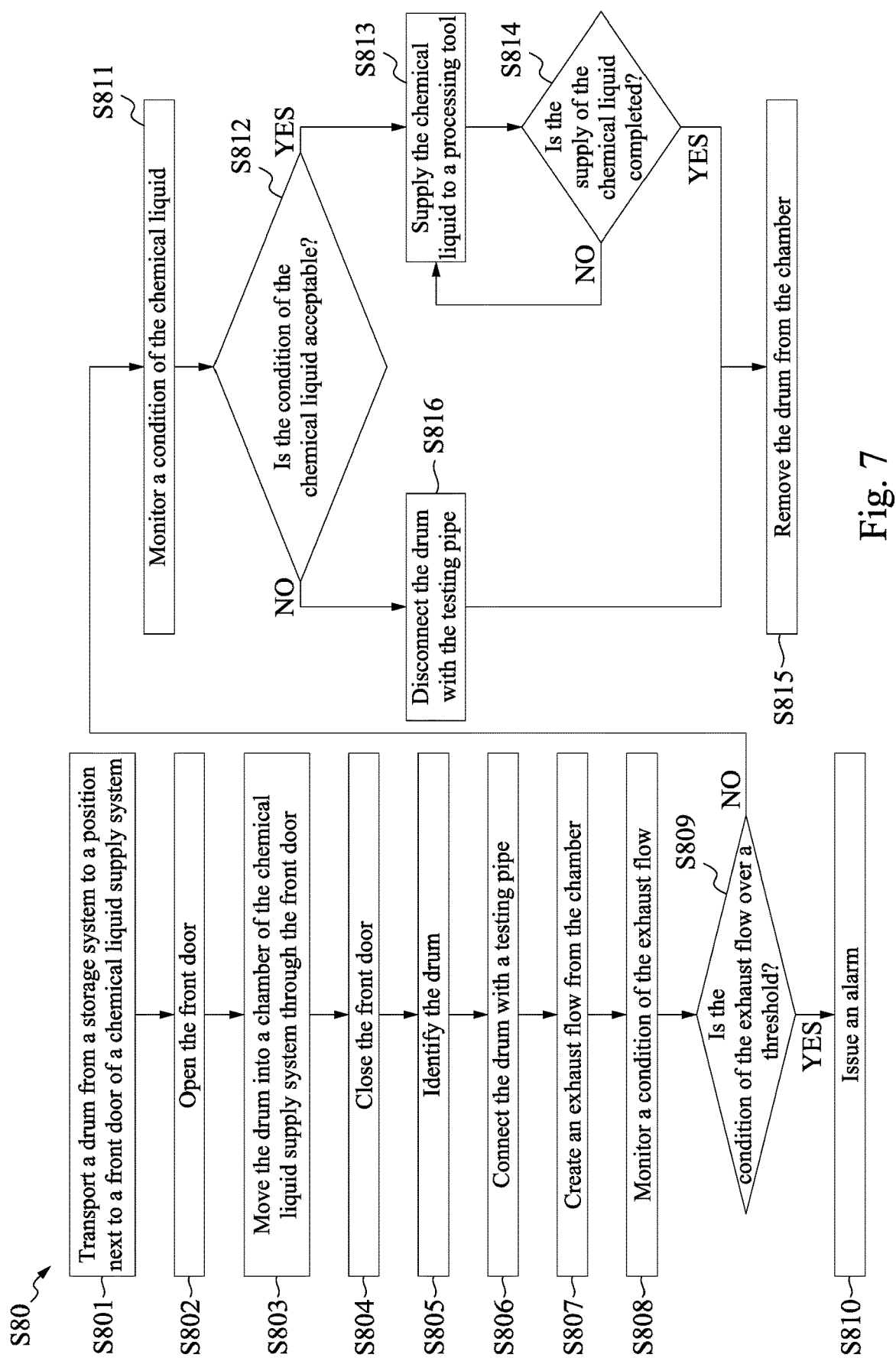
FIG. 7 shows a flow chart illustrating a method for supplying a chemical liquid in a semiconductor fabrication facility, in accordance with some embodiments.

FIG. 7 is a flow chart illustrating a method S80 for supplying a chemical liquid in the fabrication facility 1, in accordance with some embodiments. It is to be appreciated that additional operations may be performed. Moreover, not all operations may be needed to perform the disclosure provided herein. Further, some of the operations may be performed simultaneously or in a different order than shown in FIG. 7. In some implementations, one or more other operations may be performed in addition to or in place of the presently described operations. For illustrative purposes, method S80 is described with reference to FIGS. 1 and 8-15. However, method S80 is not limited to these embodiments.

Figure 8:
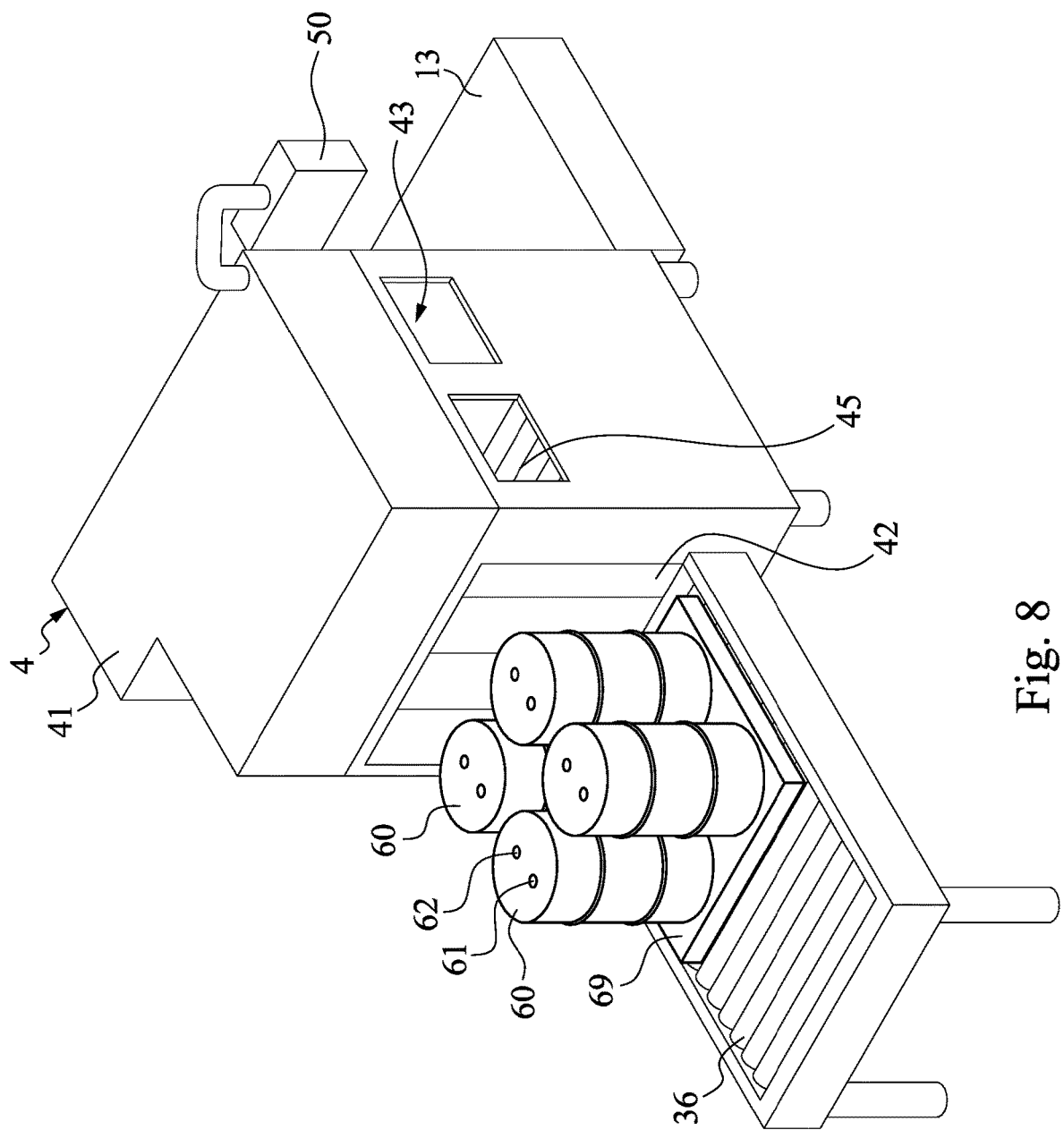
FIG. 8 shows a schematic view of a stage of a method for testing a chemical liquid in semiconductor fabrication facility in which a number of drums are transferred next to a front door of a chemical liquid supplying system, in accordance with some embodiments.

The method S80 begins with operation S801, in which one or more than one drums 60 are transported from the storage system 2 to a position next to the front door 42 of the chemical liquid supplying system 4. In some embodiments, as shown in FIG. 1, four drums 60 are placed on a pallet 69 and stored in one of the storage shelves 22 of the storage system 2. To transport the requested drums 60 from the storage system 2 to the position (e.g., the conveyor 36) next to the front door 42, the drums 60 along with the underlying pallet 69 are extracted from the storage shelf 22 by the transferring mechanism 23 and moved to the output port 25. Then, the output port 25 and the output station 35 move the drums 60 and the pallet 69 to the shuttle car 33, and the shuttle car 33 transports the drums 60 and the pallet 69 to one of the conveyors 36 that corresponds to one of the chemical liquid supplying system 4 at which the drums 60 are going to be used, as shown in FIG. 8. In some embodiments, operation S801 takes about 4 minutes to about 6 minutes. In other embodiments, operation S801 takes about 5 minutes.

The method S80 continues with operation S802, in which the front door 42 is opened. In some embodiments, the front door 42 of the chemical liquid supplying system 4 is automatically opened after detecting the presence of the drums 60 at the conveyors 36, as shown in FIG. 9. The presence of the drums 60 on the conveyors 36 can be detected by applying a suitable sensor, such as photo sensor. The data representing the presence of the drums 60 is sent to the control module 50, and the control module 50 triggers control signals to control the movement of the front door 42. In some embodiments, operation S802 takes about 20 seconds to about 40 minutes. In other embodiments, operation S802 takes about 30 seconds.

Figure 10:
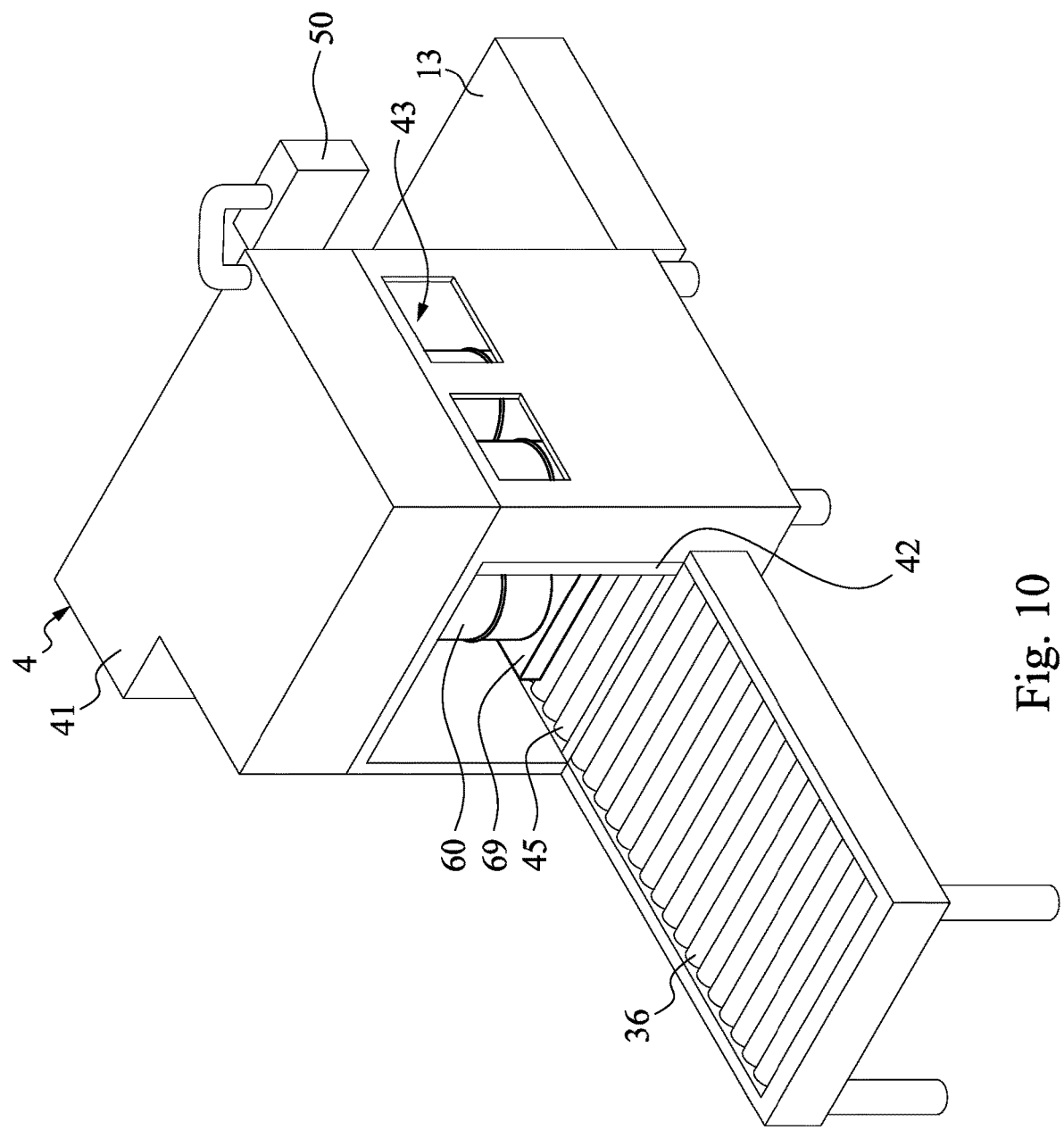
FIG. 10 shows a schematic view of a stage of a method for testing a chemical liquid in semiconductor fabrication facility in which a number of drums are transferring into a chemical liquid supplying system via a front door, in accordance with some embodiments.

The method S80 continues with operation S803, the drums 60 along with the pallet 69 are moved into the chamber 43 of the chemical liquid supplying system 4 through the front door 42. In some embodiments, as shown in FIG. 10, the movement of the drums 60 is driven by the conveyor 36 and the rollers 45. Operation S803 may be initiated after the completion of operation S802. In some embodiments, operation S801 takes about 30 seconds to about 90 seconds. In other embodiments, operation S801 takes about 1 minute.

Figure 11:
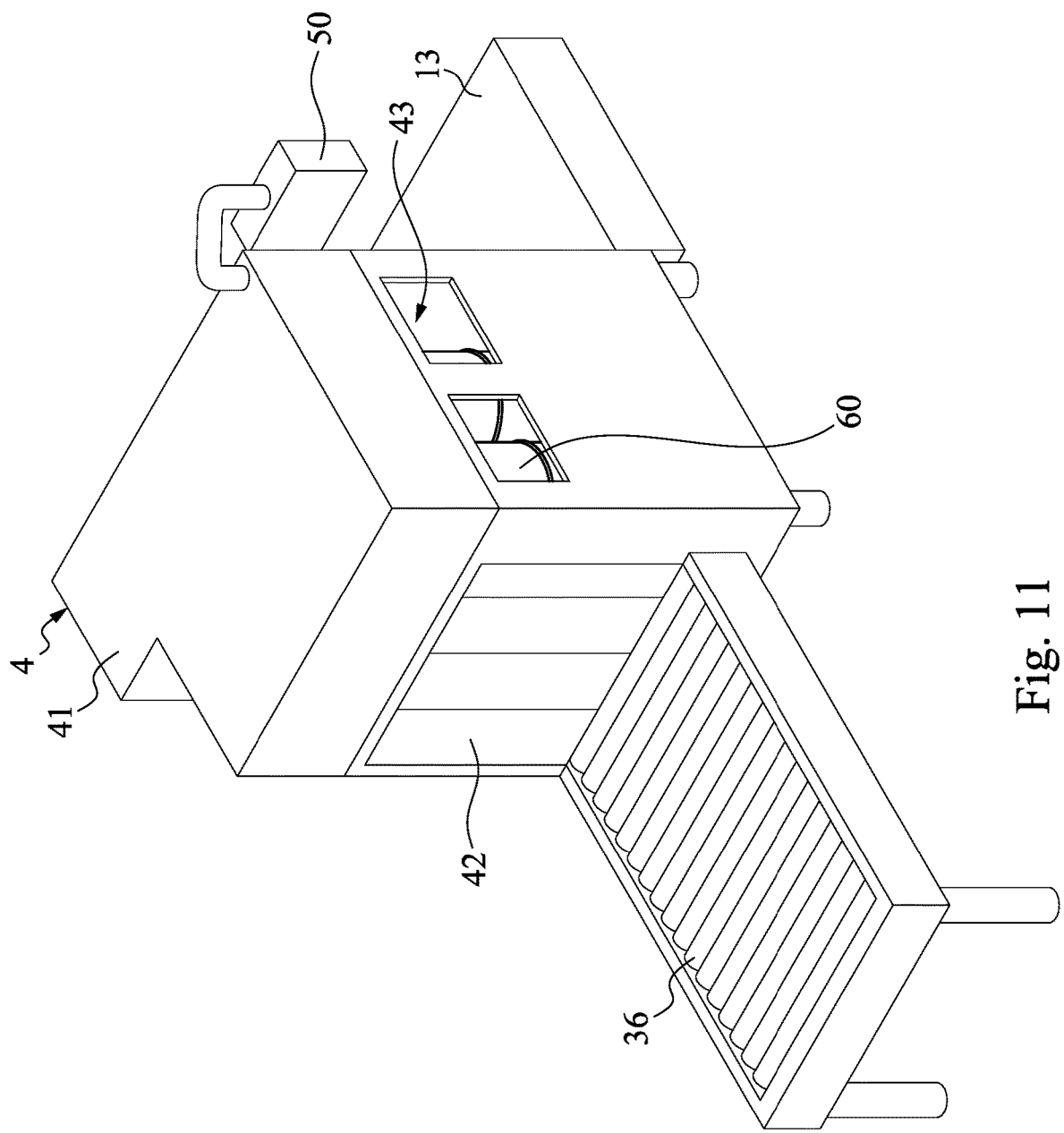
FIG. 11 shows a schematic view of a stage of a method for testing a chemical liquid in semiconductor fabrication facility in which a number of drums are transferred into a chemical liquid supplying system and a front door of the chemical liquid supplying system is closed, in accordance with some embodiments.
Figure 12:
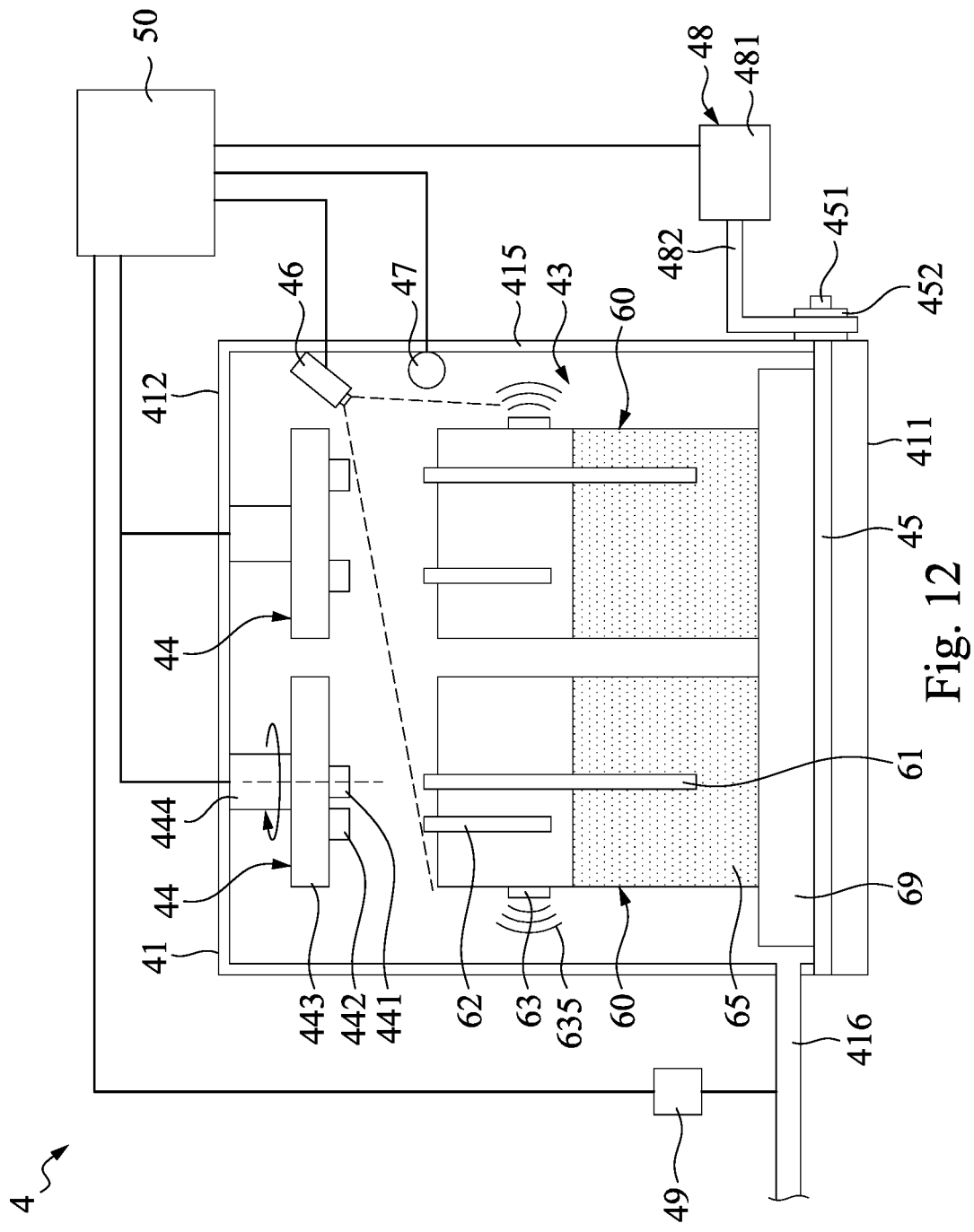
FIG. 12 shows a schematic view of a stage of a method for testing a chemical liquid in semiconductor fabrication facility in which identities and images in relation to a number of drums are produced, in accordance with some embodiments.

Once the drums 60 are moved into the chamber 43, the method S80 continues with operation S804 to close the front door 42, as shown in FIG. 11. In some embodiments, the front door 42 is actuated to close in response to control signals issued by the control module 50, and the control module 50 issue the control signals after the detection of the drums 60 being positioned in the chamber 43. The position of the drums 60 in the chamber 43 can be detected by applying suitable sensor, such as photo sensors.

The method S80 continues with operation S805, in which an identity of each of the drums 60 is reorganized. In some embodiments, after the presence of the drums 60 in the chamber 43, the scanning module 47 is triggered to transmit radio energy. Once the tag 63 is powered by the radio energy, the tag 63 transmits signals 635 representing information of the drum 60 on which the tag 63 is attached to the scanning module 47. The scanning module 47 forwards the data representing the information of the drums 60 in the chamber 43 to the control module 50. The information of the drum 60 may include the identity of the drum 60, and the control module 50 match the identity of the drum 60 and what chemical liquid is stored in the corresponding drum 60 according to a database stored in a memory device of the control module 50.

The method S80 continues with operation S806, in which the drums 60 are connected to the liquid monitoring module 70. In some embodiments, before the operation S806 is performed, one or more images in relation to the outlet nozzle 61 and the inlet nozzle 62 are produced by the imaging module 46. The data representing the images of the outlet nozzle 61 and the inlet nozzle 62 is sent to the control module 50 for imaging analysis to determine the position of the outlet nozzle 61 and the inlet nozzle 62. The control module 50 outputs control signals to the actuator 444 to rotate the carrier head 443 so as to align the outlet connector 441 with the outlet nozzle 61 and align the inlet connector 442 with the inlet nozzle 62. After the alignment process, the control module 50 outputs control signals to the actuator 444 to lower the carrier head 443 along a direction indicated by the arrows shown in FIG. 13. As a result, the outlet connector 441 is connected with the outlet nozzle 61, and the inlet connector 442 is connected with the inlet nozzle 62.

Figure 13:
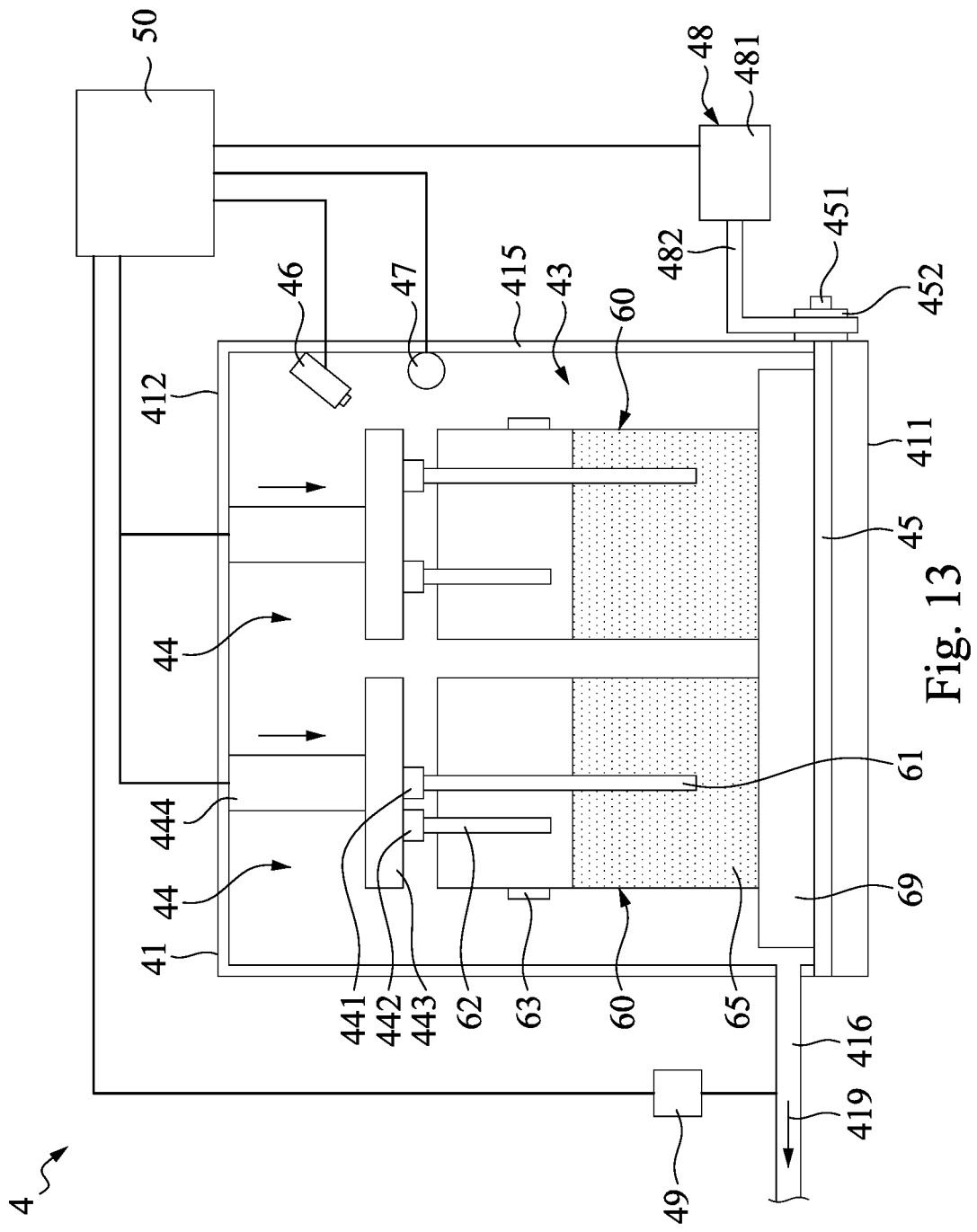
FIG. 13 shows a schematic view of a stage of a method for testing a chemical liquid in semiconductor fabrication facility in which a number of drums are connected to inlet connector and outlet connector for supplying the chemical liquid, in accordance with some embodiments.
Figure 14:
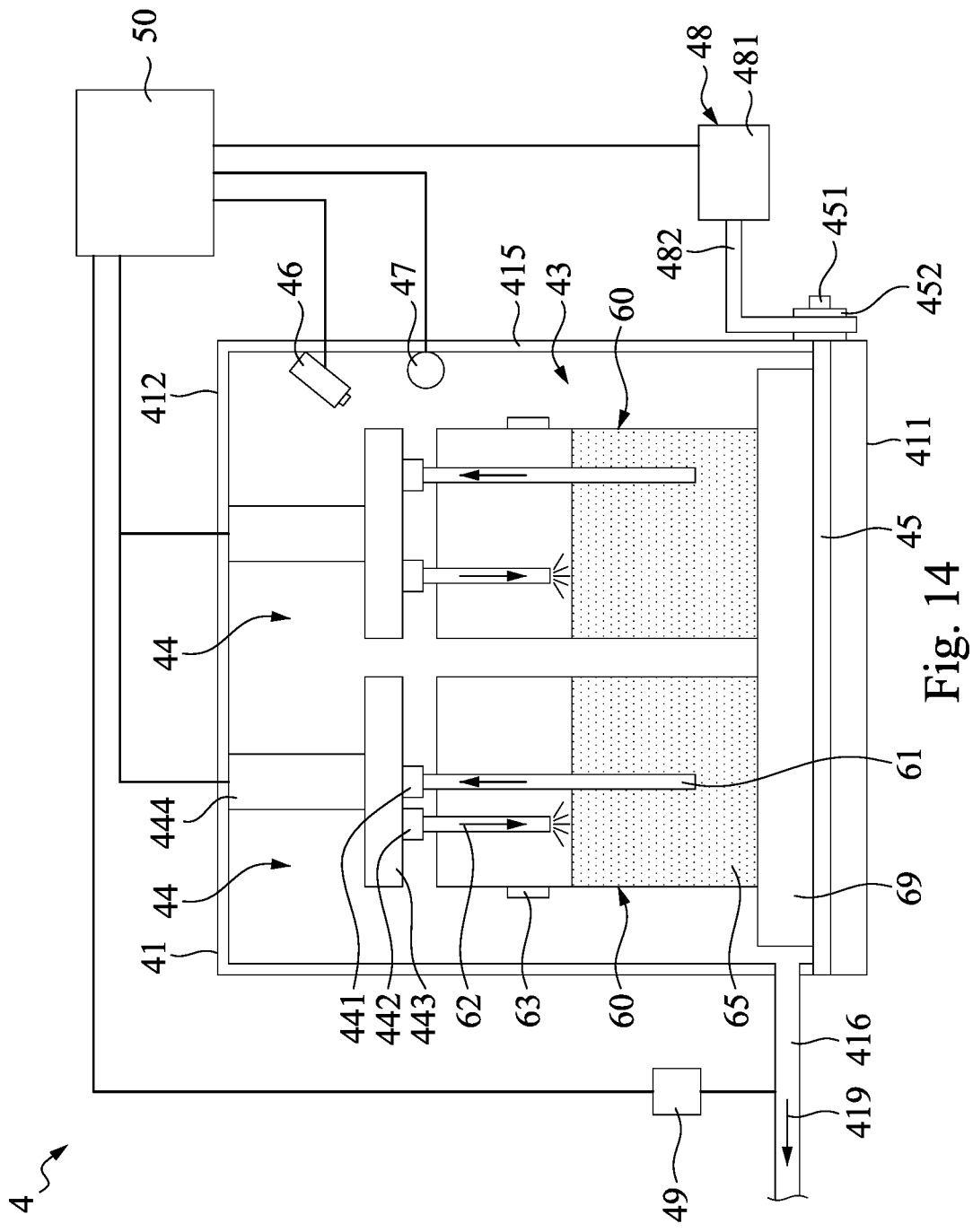
FIG. 14 shows a schematic view of a stage of a method for testing a chemical liquid in semiconductor fabrication facility in which a circulation of the chemical liquid in a number of drums are performed, in accordance with some embodiments.

The method S80 continues with operation S807, in which an exhaust flow 419 is created from the chamber 43. In some embodiments, as shown in FIG. 13, the exhaust flow 419 is guided by the gas outlet 416. Operation S807 may be initiated during operation S803 and not stopped until the drums 60 are removed from the chamber 43.

The method S80 continues with operation S808, in which at least one condition of the exhaust flow 419 is monitored. In some embodiments, concentration of hazardous gas in the exhaust flow 419 is detected by the gas detector 49. When the concentration of hazardous gas in the exhaust flow 419 is below a threshold, the method S80 continues with operation S811, or otherwise an alarm is issued in operation S810. In operation S810, the guiding of the chemical liquid 65 in the drum 60 into the testing pipe 71 may be stopped to avoid more liquid leakage.

In some embodiments, volatile gas is generated due to liquid leaks caused by broken drums or due to improper connection between the drums 60 and the connecting modules 44. By monitoring the condition of the exhaust gas, these issues may be indicated in an early stage, and the control module 50 will undertake an immediate response and handle it properly, for example, reconnect the connecting modules 44 and the drums 60.

Figure 15:
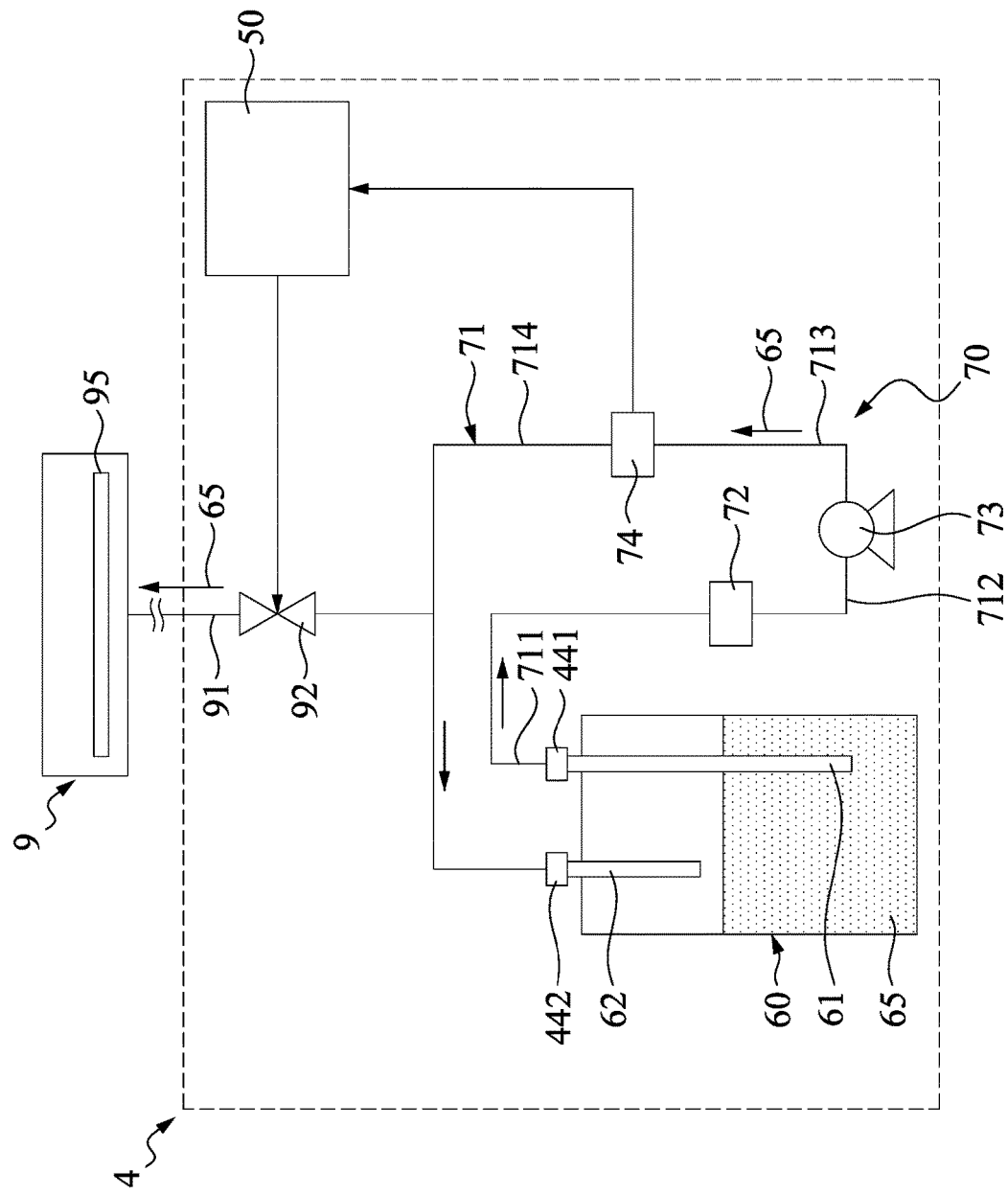
FIG. 15 shows a schematic view of a stage of a method for testing a chemical liquid in semiconductor fabrication facility in which a condition of the chemical liquid is monitored, in accordance with some embodiments.

In operation S811, at least one condition of the chemical liquid 65 is monitored. In some embodiments, as shown in FIG. 15, the chemical liquid 65 in the drum is sampled by the liquid monitoring module 70 after the outlet nozzle 61 and the inlet nozzle 62 are connected with the outlet connector 441 and the inlet connector 442. Specifically, the pump 73 actuates the flow of the chemical liquid 65 in the testing pipe 71, and re-circulates the chemical liquid 65 into the drum 60. The flow of the chemical liquid 65 passes through the filter 72 before passing through the liquid detection assembly 74. In some embodiments, operation S811 will not be initiated until the circulation of the chemical liquid 65 is performed for a predetermined time, for example, about 1 minute to about 3 minutes, so as increase the uniformity of the chemical liquid 65 stored in the drum 60.

In some embodiments, in operation S811, composition of the chemical liquid 65 is measured by the light source 742 and the transducer 743 (FIG. 6), and the data representing the composition of the chemical liquid 65 is sent to control module 50 to determine if the composition of the chemical liquid 65 is acceptable (operation S812) through an infrared spectroscopy technique. The data representing the composition of the chemical liquid 65 may be compared with another data representing a composition of a standard chemical liquid.

Alternatively or additionally, in operation S811, an image in relation to the chemical liquid 65 is produced by the camera 741 (FIG. 6). The image in relation to the chemical liquid 65 is sent to the control module 50 for image analysis to determine if the condition of the chemical liquid 65 is acceptable (operation S812). The image in relation to the chemical liquid 65 may be compared with another image in relation to a standard chemical liquid. For example, if a standard chemical liquid is blue, but the image exhibits yellow, it is determined the condition of the chemical liquid is not acceptable.

In some embodiments, the image analysis is performed prior to the infrared spectroscopy technique. When the image analysis result is not acceptable, the infrared spectroscopy technique will not be exploited to measure the composition of the chemical liquid 65. Since the infrared spectroscopy technique takes longer time than image analysis, performing image analysis prior to the infrared spectroscopy technique can save the time for testing the chemical liquid. In some embodiments, operation S811 takes about 5 seconds to about 20 seconds. In other embodiments, operation S811 takes about 10 seconds for implanting infrared spectroscopy technique.

In operation S812, when the condition of the chemical liquid 65 is determined not acceptable, the method S80 continues with operation S816 to remove the drums 60 from the chamber 43. On the contrary, when the condition of the chemical liquid 65 is acceptable, the method S80 continues with operation S813, in which the chemical liquid 65 is supplied to the processing tool 9 at which a semiconductor wafer 95 is processed.

In some embodiments, to supply the chemical liquid 65, the control module 50 issues control signals to the flow control member 92 to allow the flowing of a portion of the chemical liquid 65 from the testing pipe 71 to the supplying pipe 91. During operation S813, the supplying time or amount of the chemical liquid 65 supplied to the processing tool 9 is counted by proper means, such as a gauge, so as to determine if the chemical liquid 65 in the drum 60 has run out (operation S814). When the chemical liquid 65 has run out, the method S80 continues with operation S815 to remove the drums 60 from the chamber 43, or otherwise the supply of the chemical liquid 65 is continued.

In some embodiments, some substances in the chemical liquid 65 are decayed with an increase of time being stored in the drum 60. If the decayed substances are dispensed on the semiconductor wafer 95, a process performance of the semiconductor wafer 95 may degrade which causes product scrap. By performing the testing process (i.e., operations S811 and operation S812), the semiconductor wafer 95 can processed by correct chemical liquid, and the product yield of the semiconductor wafer 95 can be significantly improved.

In operation S815, the testing pipe 71 of the liquid monitoring module 70 are disengaged with the drums 60, and the front door 42 is open. Then, the drums 60 are removed from the chamber 43 by the roller 45 and the conveyor 36. The drums 60 may be sent back to the storage system 2 through the RGV system 3, and next requested drums 60 may be sent to the empty chemical liquid supplying systems 4 for testing and supplying process.

Figure 16:
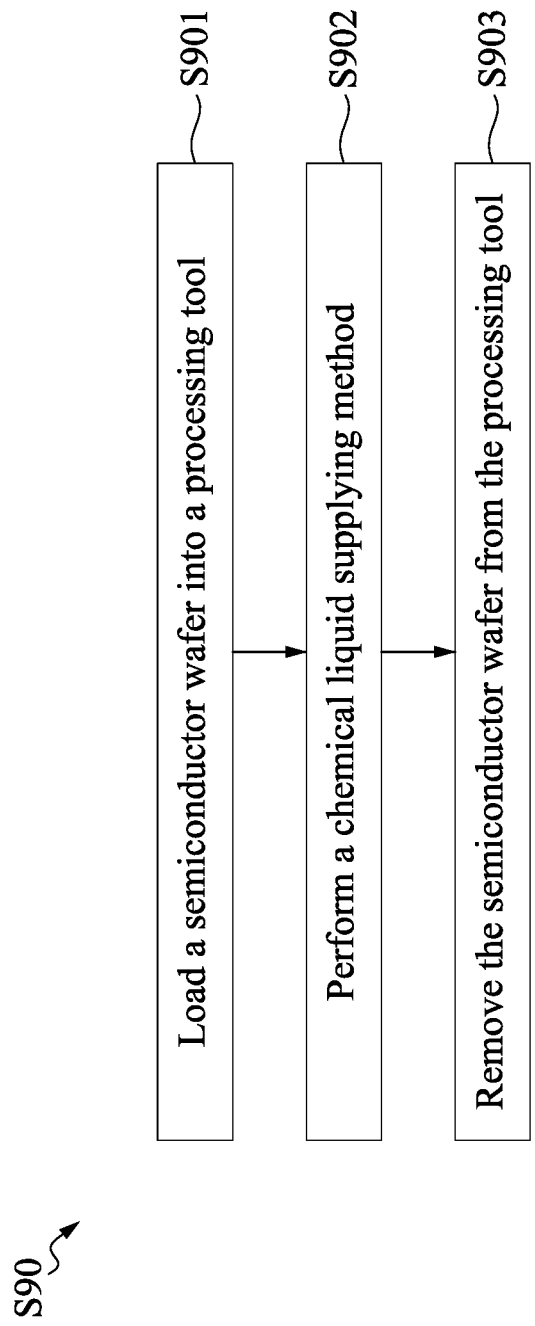
FIG. 16 shows a flow chart illustrating a method for processing a semiconductor wafer, in accordance with some embodiments.

FIG. 16 is a flow chart illustrating a method S90 for processing semiconductor wafers 5 with the use of the chemical liquid 65, in accordance with some embodiments. It is to be appreciated that additional operations may be performed. Moreover, not all operations may be needed to perform the disclosure provided herein. Further, some of the operations may be performed simultaneously or in a different order than shown in FIG. 16. In some implementations, one or more other operations may be performed in addition to or in place of the presently described operations. For illustrative purposes, method S90 is described with reference to FIG. 15. However, method S90 is not limited to these embodiments.

The method S90 includes operation S901 loading a semiconductor wafer 95 into the processing tool 9 (FIG. 15). The semiconductor wafer 95 may be made of silicon or other semiconductor materials. Alternatively or additionally, the semiconductor wafer 95 may include other elementary semiconductor materials such as germanium (Ge). In some embodiments, the semiconductor wafer 95 is made of a compound semiconductor such as silicon carbide (SiC), gallium arsenic (GaAs), indium arsenide (InAs), or indium phosphide (InP). In some embodiments, the semiconductor wafer 95 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 95 includes an epitaxial layer. For example, the semiconductor wafer 95 has an epitaxial layer overlying a bulk semiconductor. In some other embodiments, the semiconductor wafer 95 may be a silicon-on-insulator (SOI) or a germanium-on-insulator (GOI) substrate.

The semiconductor wafer 95 may have various device elements. Examples of device elements that are formed in the semiconductor wafer 95 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

The processing tool 9 is equipped to perform one or more of numerous processes or treatments, such as wafer cleaning process (including pre-cleaning, cleaning, post-cleaning processes), wet etching process, CMP (chemical mechanical polishing) process, lithography process, etc.

The method S90 also includes operation S902, in which the method S80 of supplying the chemical liquid 65 as shown in FIG. 7 is performed. Another local valve (not shown in figures) of the processing tool 9 is used to control the dispensing of the chemical liquid 65 over the semiconductor wafer 95.

The method S90 also includes operation S903, in which the semiconductor wafer 95 is removed from the processing tool 9. It is understood that the semiconductor wafer 95 fabricating according to the disclosed methods undergo further processes, including material deposition, implantation, or etching operations, to form various features such as field effect transistors, cap insulating layers, contacts/vias, silicide layers, interconnect metal layers, dielectric layers, passivation layers, metallization layers with signal lines, etc. In some embodiments, one or more layers of conductive, semiconductive, and insulating materials are formed over the substrate, and a pattern is formed in one or more of the layers.

FIG. 17 shows a block diagram of the controller module 50, in accordance with some embodiments. The control module 50 can include any suitable control system (e.g., workstation and portable electronic device) configured to store/execute programs for performing/monitoring various operations of the chemical liquid supplying system 4. The control module 50 can be any well-known computer capable of performing the functions and operations described herein. For example, and without limitation, the control module 50 can be capable of processing and transmitting signals. The control module 50 can be used, for example, to execute one or more operations of chemical liquid supplying system 4, method S80, and/or method S90.

The control module 50 can be configured to communicate (e.g., send instructions and receive data) with other components of the chemical liquid supplying system 4 (e.g., connecting module 44, imaging module 46, scanning module 47, driving module 48, gas detector 49 and liquid monitoring module 70) via the communication paths 526.

The communication paths 526 can include any suitable network connection mechanism, such as a communication bus, a local area network (LAN), and/or a WiFi network. In some embodiments, the control module 50 can update the instructions or the stored programs based on the data received from other components of the chemical liquid supplying system 4 via the communication path 526.

The control system 50 includes one or more processors (also called central processing units, or CPUs), such as a processor 504. The processor 504 is connected to a communication infrastructure or bus 506. The control system 50 also includes input/output device(s) 503, such as monitors, keyboards, pointing devices, etc., that communicate with communication infrastructure or bus 506 through input/output interface(s) 502. A control tool can receive instructions to implement functions and operations described herein via input/output device(s) 503. The control system 50 also includes a main memory 508, such as random access memory (RAM). The main memory 508 can include one or more levels of cache. The main memory 508 has stored therein control logic (e.g., computer software) and/or data. In some embodiments, the control logic (e.g., computer software) and/or data can include one or more of the functions described above with respect to chemical liquid supplying system 4. In some embodiments, the processor 504 can be configured to execute the control logic stored in the main memory 508.

The control system 50 can also include one or more secondary memory 510. The secondary memory 510 can include, for example, a hard disk drive 512 and/or a removable storage device 514. The removable storage device 514 can be a floppy disk drive, a magnetic tape drive, a compact disk drive, an optical storage device, tape backup device, and/or any other storage device/drive.

The removable storage device 514 can interact with a removable storage unit 518. The removable storage unit 518 includes a computer usable or readable storage device with computer software (control logic) and/or data stored thereon. The removable storage unit 518 can be a floppy disk, magnetic tape, compact disk, DVD, optical storage disk, and/ any other computer data storage device. The removable storage device 514 reads from and/or writes to the removable storage unit 518 in a well-known manner.

According to some embodiments, the secondary memory 510 can include other mechanisms, instrumentalities or other approaches for allowing computer programs and/or other instructions and/or data to be accessed by the control system 50. Such mechanisms, instrumentalities or other approaches can include, for example, a removable storage unit 522 and an interface 520. Examples of the removable storage unit 522 and the interface 520 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, the secondary memory 510, the removable storage unit 518, and/or the removable storage unit 522 can include one or more of the functions described above with respect to the chemical liquid supplying system 4.

The control system 50 can further include a communication interface 524. The communication interface 524 enables the control system 50 to communicate and interact with any combination of remote devices, remote networks, remote entities, etc. (individually and collectively referenced by reference number 528). For example, the communication interface 524 can allow the control system 50 to communicate with elements 528 over the communications path 526, which can be wired and/or wireless, and which can include any combination of LANs, WANs, the Internet, etc. Control logic and/or data can be transmitted to and from the control system 50 via the communication path 526.

The functions/operations in the preceding embodiments can be implemented in a wide variety of configurations and architectures. Therefore, some or all of the operations in the preceding embodiments—e.g., the functions of chemical liquid supplying system 4 described in FIGS. 4-6, and the methods/processes described in FIG. 7—can be performed in hardware, in software or both. In some embodiments, a tangible apparatus or article of manufacture including a tangible computer useable or readable medium with control logic (software) stored thereon is also referred to herein as a computer program product or program storage device. This includes, but is not limited to, the control system 50, the main memory 508, the secondary memory 510 and the removable storage units 518 and 522, as well as tangible articles of manufacture embodying any combination of the foregoing. Such control logic, when executed by one or more data processing devices (such as control system 50), causes such data processing devices to operate as described herein. For example, the hardware/equipment can be connected to or be part of the element 528 (remote device(s), network(s), entity(ies)) of control system 50.

The various embodiments or examples described herein offer several advantages over the existing art, as set forth above. It will be understood that not all advantages have been necessarily discussed herein, no particular advantage is required for all embodiments or examples, and other embodiments or examples may offer different advantages.

Embodiments of this disclosure provide a chemical liquid supplying system with a liquid detection assembly to test quality of the chemical liquid contained in drums. The drums are automatically conveyed from a storage system to the chemical liquid supplying system and automatically connected to an inlet connector of a liquid supplying line for the chemical liquid supply. As a result, the need for manpower in preparing the chemical liquid supply can be reduced or eliminated. In addition, since the chemical liquid will not be supplied to a processing tool before the quality of the chemical liquid is checked, a concern of supplying degrading chemical liquid to the processing tool can be mitigated.

In accordance with some embodiments, a method for processing semiconductor wafer is provided. The method includes connecting a drum which stores the chemical liquid with a testing pipe. The method also includes guiding the chemical liquid in the drum into the testing pipe. In addition, the method includes detecting a condition of the chemical liquid in the testing pipe. The method further includes determining if the condition of the chemical liquid is acceptable. When the condition of the chemical liquid is acceptable, supplying the chemical liquid to a processing tool at which the semiconductor wafer is processed. In some embodiments, the detecting the condition of the chemical liquid in the testing pipe comprises: producing an image in relation to the chemical liquid in the testing pipe; analyzing the image to generate a data associated with the image; and comparing data associated with the image with data representing the chemical liquid in a standard stage. In some embodiments, the detecting the condition of the chemical liquid in the testing pipe comprises: emitting a first light beam toward the testing pipe, wherein the first light beam is transferred to a second light beam after passing through the chemical liquid; receiving the second light beam with a transducer; analyzing the second light beam to generate a data associated with the second light beam; and comparing the data associated with the second light beam with data representing the chemical liquid in a standard stage. In some embodiments, the method further includes circulating the chemical liquid back to the drum through the testing pipe; and guiding a portion of the chemical liquid from the testing pipe to a supplying pipe which is connected with the processing tool. In some embodiments, the method further includes moving the drum into a chamber at which the drum is connected with the testing pipe; generating an exhaust flow from the chamber; detecting a condition of the exhaust flow; determining if the condition of the exhaust flow is over a threshold; and when the condition of the exhaust flow is determined over the threshold, stopping the guiding of the chemical liquid in the drum into the testing pipe and issuing an alarm. In some embodiments, the method further includes moving the drum into a chamber at which the drum is connected with the testing pipe; producing an image in relation to an outlet nozzle and an inlet nozzle of the drum; rotating an inlet connector and an outlet connector which are connected to the testing pipe to align the inlet nozzle and the outlet nozzle based on the image; and connecting the inlet connector with the inlet nozzle and connecting the outlet connector with the outlet nozzle after the rotation of the inlet connector and the outlet connector of the testing pipe. In some embodiments, the method further includes moving the drum into a chamber at which the drum is connected with the testing pipe; and after the drum is moved into the chamber, closing a front door of the chamber to form an air-tight enclosure in the chamber. In some embodiments, the method further includes identifying the drum by scanning an RFID (radio-frequency identification) tag attached on the drum to reorganize what chemical liquid is intended to be stored in the drum.

In accordance with some embodiments, a method for testing a chemical liquid in semiconductor fabrication facility is provided. The method includes moving a drum which stores the chemical liquid from a storage system to a position next to a chemical liquid supplying system. The method also includes moving the drum into a chamber in the chemical liquid supplying system through the front door. The method further includes connecting the drum with a testing pipe and guiding the chemical liquid in the drum into the testing pipe. In addition, the method includes detecting a condition of the chemical liquid in the testing pipe. The method further includes determining if the condition of the chemical liquid is acceptable. When the condition of the chemical liquid is not acceptable, removing the drum from the chamber of the chemical liquid supplying system. In some embodiments, the detecting the condition of the chemical liquid in the testing pipe comprises: producing an image in relation to the chemical liquid in the testing pipe; analyzing the image to generate a data associated with the image; and comparing data associated with the image with data representing the chemical liquid in a standard stage. In some embodiments, the detecting the condition of the chemical liquid in the testing pipe comprises: emitting a first light beam toward the testing pipe, wherein the first light beam transferred to a second light beam after passing through the chemical liquid; receiving the second light beam with a transducer; analyzing the second light beam to generate a data associated with the second light beam; and comparing the data associated with the second light beam with data representing the chemical liquid in a standard stage. In some embodiments, the method further includes when the condition of the chemical liquid is acceptable, supplying the chemical liquid to a processing tool at which a semiconductor wafer is processed. In some embodiments, the method further includes generating an exhaust flow from the chamber; detecting a condition of the exhaust flow; determining if the condition of the exhaust flow is over a threshold; and when the condition of the exhaust flow is determined over the threshold, stopping the guiding of the chemical liquid in the drum into the testing pipe and issuing an alarm. In some embodiments, the method further includes producing an image in relation to an outlet nozzle and an inlet nozzle of the drum; rotating an inlet connector and an outlet connector which are connected to the testing pipe to align the inlet nozzle and the outlet nozzle based on the image; and connecting the inlet connector with the inlet nozzle and connecting the outlet connector with the outlet nozzle after the rotation of the inlet connector and the outlet connector of the testing pipe. In some embodiments, the position is next to the front door of the chemical liquid supplying system, and the drum is moved into the chamber through the front door. The method further includes: after the drum is moved into the chamber, closing the front door of the chamber to form an air-tight enclosure in the chamber. In some embodiments, the method further includes identifying the drum by scanning an RFID (radio-frequency identification) tag attached on the drum to reorganize what chemical liquid is intended to be stored in the drum.

In accordance with some embodiments, a chemical liquid supplying system is provided. The chemical liquid supplying system includes a chamber and a roller located in the chamber. The chemical liquid supplying system also includes a connecting module located in the chamber and above the roller. The chemical liquid supplying system further includes a testing pipe connected to the connecting module. In addition, the chemical liquid supplying system includes a liquid detection assembly positioned relative to the testing pipe. The chemical liquid supplying system further includes a control module electrically connected to liquid detection assembly and configured to determine if the chemical liquid is acceptable or not. In some embodiments, at least a portion of the testing pipe that is next to the liquid detection assembly is formed of a light-permeable material and the liquid detection assembly comprises a camera or a mass spectrometer. In some embodiments, the system further includes a gas detector connected to the chamber and configured to detect a condition of an exhaust gas from the chamber. The control module is electrically connected to the gas detector and configured to issue an alarm when the condition of the gas in the chamber is over a threshold. In some embodiments, the system further includes a front door located at a side of the chamber. The front door is automatically operated, and when the front door is closed, an air-tight enclosure is formed in the chamber.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for processing a semiconductor wafer, comprising:
   connecting a drum which stores a chemical liquid with a testing pipe;
   guiding the chemical liquid in the drum into the testing pipe;
   detecting a condition of the chemical liquid in the testing pipe;
   determining if the condition of the chemical liquid is acceptable;
   when the condition of the chemical liquid is acceptable, supplying the chemical liquid to a processing tool at which the semiconductor wafer is processed; and
   identifying the drum by scanning an RFID (radio-frequency identification) tag attached on the drum to reorganize what chemical liquid is intended to be stored in the drum.

2. The method as claimed in claim 1, wherein the detecting the condition of the chemical liquid in the testing pipe comprises:
   producing an image in relation to the chemical liquid in the testing pipe;
   analyzing the image to generate a data associated with the image; and
   comparing the data associated with the image with data representing the chemical liquid in a standard stage.

3. The method as claimed in claim 1, wherein the detecting the condition of the chemical liquid in the testing pipe comprises:
   emitting a first light beam toward the testing pipe, wherein the first light beam is transferred to a second light beam after passing through the chemical liquid;
   receiving the second light beam with a transducer;
   analyzing the second light beam to generate a data associated with the second light beam; and
   comparing the data associated with the second light beam with data representing the chemical liquid in a standard stage.

4. The method as claimed in claim 1, further comprising:
   circulating the chemical liquid back to the drum through the testing pipe; and
   guiding a portion of the chemical liquid from the testing pipe to a supplying pipe which is connected with the processing tool.

5. The method as claimed in claim 1, further comprising:
   moving the drum into a chamber at which the drum is connected with the testing pipe;
   generating an exhaust flow from the chamber;
   detecting a condition of the exhaust flow;
   determining if the condition of the exhaust flow is over a threshold; and
   when the condition of the exhaust flow is determined over the threshold, stopping the guiding of the chemical liquid in the drum into the testing pipe and issuing an alarm.

6. The method as claimed in claim 1, further comprising:
   moving the drum into a chamber at which the drum is connected with the testing pipe;
   producing an image in relation to an outlet nozzle and an inlet nozzle of the drum;
   rotating an inlet connector and an outlet connector which are connected to the testing pipe to align the inlet nozzle and the outlet nozzle based on the image; and
   connecting the inlet connector with the inlet nozzle and connecting the outlet connector with the outlet nozzle after the rotation of the inlet connector and the outlet connector of the testing pipe.

7. The method as claimed in claim 1, further comprising:
   moving the drum into a chamber at which the drum is connected with the testing pipe; and
   after the drum is moved into the chamber, closing a front door of the chamber to form an air-tight enclosure in the chamber.

8. A method of testing a chemical liquid in a fabrication facility, comprising:
   moving a drum which stores the chemical liquid from a storage system to a position next to a chemical liquid supplying system;
   moving the drum into a chamber in the chemical liquid supplying system through a front door;
   connecting the drum with a testing pipe;
   guiding the chemical liquid in the drum into the testing pipe;
   detecting a condition of the chemical liquid in the testing pipe;
   determining if the condition of the chemical liquid is acceptable; and
   when the condition of the chemical liquid is not acceptable, removing the drum from the chamber of the chemical liquid supplying system.

9. The method as claimed in claim 8, wherein the detecting the condition of the chemical liquid in the testing pipe comprises:
   producing an image in relation to the chemical liquid in the testing pipe;
   analyzing the image to generate a data associated with the image; and
   comparing the data associated with the image with data representing the chemical liquid in a standard stage.

10. The method as claimed in claim 8, wherein the detecting the condition of the chemical liquid in the testing pipe comprises:
    emitting a first light beam toward the testing pipe, wherein the first light beam transferred to a second light beam after passing through the chemical liquid;
    receiving the second light beam with a transducer;
    analyzing the second light beam to generate a data associated with the second light beam; and
    comparing the data associated with the second light beam with data representing the chemical liquid in a standard stage.

11. The method as claimed in claim 8, further comprising:
    when the condition of the chemical liquid is acceptable, supplying the chemical liquid to a processing tool at which a semiconductor wafer is processed.

12. The method as claimed in claim 8, further comprising:
    generating an exhaust flow from the chamber;
    detecting a condition of the exhaust flow;
    determining if the condition of the exhaust flow is over a threshold; and
    when the condition of the exhaust flow is determined over the threshold, stopping the guiding of the chemical liquid in the drum into the testing pipe and issuing an alarm.

13. The method as claimed in claim 8, further comprising:
    producing an image in relation to an outlet nozzle and an inlet nozzle of the drum;
    rotating an inlet connector and an outlet connector which are connected to the testing pipe to align the inlet nozzle and the outlet nozzle based on the image; and
    connecting the inlet connector with the inlet nozzle and connecting the outlet connector with the outlet nozzle after the rotation of the inlet connector and the outlet connector of the testing pipe.

14. The method as claimed in claim 8, wherein the position is next to the front door of the chemical liquid supplying system, and the drum is moved into the chamber through the front door, the method further comprises:
   after the drum is moved into the chamber, closing the front door of the chamber to form an air-tight enclosure in the chamber.

15. The method as claimed in claim 8, further comprising:
   identifying the drum by scanning an RFID (radio-frequency identification) tag attached on the drum to reorganize what chemical liquid is intended to be stored in the drum.

16. A method for processing a semiconductor wafer, comprising:
   moving a drum containing a chemical liquid from a storage system into a chamber of a chemical liquid supplying system;
   connecting the drum with a testing pipe disposed in the chamber of the chemical liquid supplying system;
   pumping the chemical liquid from the drum to the testing pipe;
   re-circulating the chemical liquid in the testing pipe back into the drum;
   after re-circulating the chemical liquid, pumping the chemical liquid from the drum to the testing pipe again;
   after pumping the chemical liquid again, monitoring a condition of the chemical liquid in the testing pipe; and
   supplying the chemical liquid to a processing tool at which a semiconductor wafer is processed after monitoring the condition of the chemical liquid.

17. The method of claim 16, wherein monitoring the condition of the chemical liquid in the testing pipe comprises:
   emitting a first light beam to the testing pipe, wherein the first light beam is transferred to a second light beam after passing through the chemical liquid;
   receiving the second light beam with a mass spectrometer; and
   determining if the condition of the chemical liquid is acceptable based on the second light beam received by the mass spectrometer.

18. The method of claim 16, further comprising filtering the chemical liquid prior to monitoring the condition of the chemical liquid in the testing pipe.

19. The method of claim 16, further comprising controlling a flow of the chemical liquid to the processing tool.

20. The method of claim 1, further comprising controlling a flow of the chemical liquid supplied to the processing tool.

* * * * *